United States Patent
Muto et al.

(10) Patent No.: US 7,667,307 B2
(45) Date of Patent: Feb. 23, 2010

(54) SEMICONDUCTOR DEVICE

(75) Inventors: Kuniharu Muto, Tokyo (JP); Toshiyuki Hata, Tokyo (JP); Hiroshi Sato, Tokyo (JP); Hiroi Oka, Tokyo (JP); Osamu Ikeda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/057,328

(22) Filed: Mar. 27, 2008

(65) Prior Publication Data

US 2008/0265386 A1 Oct. 30, 2008

(30) Foreign Application Priority Data

Apr. 27, 2007 (JP) ............................. 2007-118833
Jun. 20, 2007 (JP) ............................. 2007-162684

(51) Int. Cl.
*H01L 23/495* (2006.01)
(52) U.S. Cl. ...................................... 257/672; 257/676
(58) Field of Classification Search ................. 257/672, 257/676
See application file for complete search history.

(56) References Cited

U.S. PATENT DOCUMENTS

| 6,084,264 | A | 7/2000 | Darwish |
| 6,538,303 | B1 * | 3/2003 | Kushino ...................... 257/666 |
| 6,943,456 | B2 * | 9/2005 | Miyaki et al. ................ 257/784 |
| 2001/0001494 | A1 | 5/2001 | Kocon |
| 2007/0172980 | A1 * | 7/2007 | Tanaka et al. ................ 438/106 |

FOREIGN PATENT DOCUMENTS

| JP | 2000-164869 A | 6/2000 |
| JP | 2000-299464 A | 10/2000 |
| JP | 2002-313851 | * 10/2002 |

* cited by examiner

*Primary Examiner*—Thien F Tran
(74) *Attorney, Agent, or Firm*—Miles & Stockbridge P.C.

(57) ABSTRACT

To actualize a reduction in the on-resistance of a small surface mounted package having a power MOSFET sealed therein. A silicon chip is mounted on a die pad portion integrated with leads configuring a drain lead. The silicon chip has, on the main surface thereof, a source pad and a gate pad. The backside of the silicon chip configures a drain of a power MOSFET and bonded to the upper surface of a die pad portion via an Ag paste. A lead configuring a source lead is electrically coupled to the source pad via an Al ribbon, while a lead configuring a gate lead is electrically coupled to the gate pad via an Au wire.

2 Claims, 29 Drawing Sheets

FIG. 10

■ DISPLACEMENT AT RUPTURE (CALCULATED VALUE) OF VARIOUS Ag PASTES

| d: DISPLACEMENT AT RUPTURE | P: FORCE IN A SHEARING DIRECTION (SHEAR STRENGTH) |
| S: CROSS-SECTIONAL AREA (ADHESION AREA) | L: ADHESION THICKNESS |
| $\tau$: SHEAR STRESS | E: MODULUS OF ELASTICITY (YOUNG'S MODULUS) |
| $\gamma$: SHEAR STRAIN | |
| G: MODULUS IN TORSION | |
| $\mu$: POISSON'S RATIO (0.3) | SHEAR STRENGTH = P/S |

- $\tau = P/S$
- $\gamma = d/L = \tau/G$         $\Bigg\} \; d = 2(\mu+1) L \cdot P / (E \cdot S)$
- $G = E/(2(\mu+1))$ ⇒ MODULUS OF ELASTICITY (Pa) = 
2.6 × ADHESION THICKNESS (μm) / DISPLACEMENT (μm) AT RUPTURE × SHEAR STRENGTH (Pa)

⇒ DISPLACEMENT AT RUPTURE > DISPLACEMENT PERMITTING ULTRASONIC BONDING OF AL RIBBON
(Ag PASTE DISPLACEMENT DURING BONDING SATISFIES THE FOLLOWING EQUATION.

MODULUS OF ELASTICITY (Pa) < 2.6 × ADHESION THICKNESS (μm) / DISPLACEMENT (μm) PERMITTING ULTRASONIC BONDING OF AL RIBBON × SHEAR STRENGTH (Pa)

SEMICONDUCTOR DEVICE

CROSS-REFERENCE TO RELATED APPLICATIONS

The disclosures of Japanese Patent Applications No. 2007-162684 and No. 2007-118833 respectively filed on Jun. 20, 2007 and on Apr. 27, 2007 each including the specification, drawings and abstract are incorporated herein by reference in its entirety.

BACKGROUND OF THE INVENTION

The present invention relates to a semiconductor device, in particular, to a semiconductor device having a small surface mounted package.

A power MOSFET (Metal Oxide Semiconductor Field Effect Transistor) used for power control switch or charge/discharge protection circuit of portable information devices is sealed in a small surface mounted package such as SOP8. Such a kind of a power MOSFET is described, for example, in Japanese Patent Laid-Open No. 2000-164869 or Japanese Patent Laid-Open No. 2000-299464.

Japanese Patent Laid-Open No. 2000-164869 discloses a technology for reducing the risk of punch-through breakdown, in a trench gate power MOSFET (Metal Oxide Semiconductor Field Effect Transistor) formed in a structure including a p type epitaxial layer configuring the upper layer of an $n^+$ type silicon substrate, by forming an n type drain region so that it extends between an $n^+$ type silicon substrate and the bottom of a trench and forming a junction between the n type drain region and the p type epitaxial layer so that it extends between the $n^+$ type silicon substrate and the partition of the trench.

Japanese Patent Laid-Open No. 2000-299464 discloses a technology for reducing the on-resistance of a drain region by laying an epitaxial layer of a first conductivity type and a well layer of a second conductivity type over a semiconductor substrate of the first conductivity type, forming a deep trench gate, isolated by an insulating layer, in an upper side layer comprised of these epitaxial layer and well layer, forming a drain region below the trench gate, forming a source region adjacent to the trench gate and forming, over the well layer, a body region more heavily doped with an impurity than the well layer.

SUMMARY OF THE INVENTION

The present inventors investigated an SOP8 for sealing the above-described power MOSFET therein. The SOP8 investigated by the present inventors have a package structure in which a silicon chip having a power MOSFET formed thereon is sealed with a molding resin.

The silicon chip is mounted on a die pad portion integrated with a drain lead, with its main surface up. The backside of the silicon chip forms a drain of the power MOSFET and is bonded to the upper surface of the die pad portion via an Ag paste.

The silicon chip has, on the main surface thereof, a source pad and a gate pad. The source pad and gate pad are made of a conductive film comprised mainly of an Al film formed on the uppermost layer of the silicon chip. The source pad has a wider area than the gate pad in order to reduce the on-resistance of the power MOSFET. For a similar reason, the entire backside surface of the silicon chip forms the drain of the power MOSFET.

Outside the molding resin, a source lead, drain lead and gate lead configuring external connection terminals of the SOP8 are exposed. The source lead and source pad, and the gate lead and gate pad are electrically coupled to each other via an Au wire. The gate pad having a small area is coupled to the gate lead with a single Au wire. The source pad having a wider area than the gate pad is, on the other hand, electrically coupled to the source lead with a plurality of Au wires.

In the SOP8 having such a structure, however, a contact resistance between the source pad and the Au wire or between the source lead and the Au wire cannot be reduced sufficiently. Such a difficulty in reducing the contact resistance occurs because a small contact area between the source pad or source lead and the Au wire makes it difficult to provide a sufficient contact area even by increasing the number of Au wires. An increase in the area of the source pad to achieve coupling of many Au wires however increases the size of the silicon chip and therefore increases the mounting area thereof in the SOP8.

An object of the present invention is to provide a technology capable of realizing a small surface mounted package having a low on-resistance.

Another object of the present invention is to provide a technology capable of realizing size reduction of a surface mounted package.

A further object of the present invention is to provide a technology capable of realizing improvement in the production yield and reliability of a surface mounted package.

A still further object of the present invention is to provide a technology capable of realizing a reduction in the production cost of a surface mounted package.

The above-described and other objects and novel features of the present invention will be apparent from the description herein and accompanying drawings.

Outline of typical inventions of the present inventions disclosed herein will next be described briefly.

The semiconductor device of the present invention has a semiconductor chip, which has been mounted on a die pad portion of a lead frame, sealed with a resin package and having an outer lead portion of the lead frame exposed outside the resin package, wherein the lead frame has a gate lead, a source lead, a drain lead, and the die pad portion integrated with the drain lead; the semiconductor chip has, on the main surface thereof, a gate pad coupled to a gate electrode of a power MOSFET and a source pad coupled to a source of the power MOSFET and having a larger area than that of the gate pad; the backside of the semiconductor chip forming a drain of the power MOSFET is coupled onto the die pad portion with an Ag paste; and the source lead is coupled to the source pad with an Al ribbon.

In the present invention, the term "Al ribbon" means a strip-shaped connector made of a conductive material comprised mainly of Al. An Al ribbon is typically installed in a bonding apparatus while being wound around a spool. The Al ribbon is coupled to a lead or pad, for example, by ultrasonic bonding or laser bonding. Since the Al ribbon is very thin, its length or loop shape can be determined freely at the time of its coupling to a lead or pad.

There is a material called clip as a connector analogous to the Al ribbon. The clip is a thin metal plate which is made of, for example, a Cu alloy or Al and has been molded or formed in advance into a predetermined loop shape and a predetermined length. When the clip is coupled to a lead and a pad, one end of the clip is placed on the lead and the other end is placed on the pad and they are coupled simultaneously. Examples of the coupling method include solder bonding, Ag paste bonding and ultrasonic bonding.

In the present invention, the term "ribbon" means a connector including the clip. The ribbon whose length or loop shape can be determined freely depending on the area of a lead or pad or the distance between the lead and pad is however preferred to the clip whose loop shape and length have been determined in advance.

Advantages available from typical inventions of the present inventions disclosed herein will next be described briefly.

The present invention can realize a surface mounted semiconductor device having a low on-resistance.

BRIEF DESCRIPTION OF THE DRAWINGS

FIG. 10 explains a selection guideline formula for deriving an optimum elastic modulus of the Ag paste;

DETAILED DESCRIPTION OF THE PREFERRED EMBODIMENTS

Figure 1:
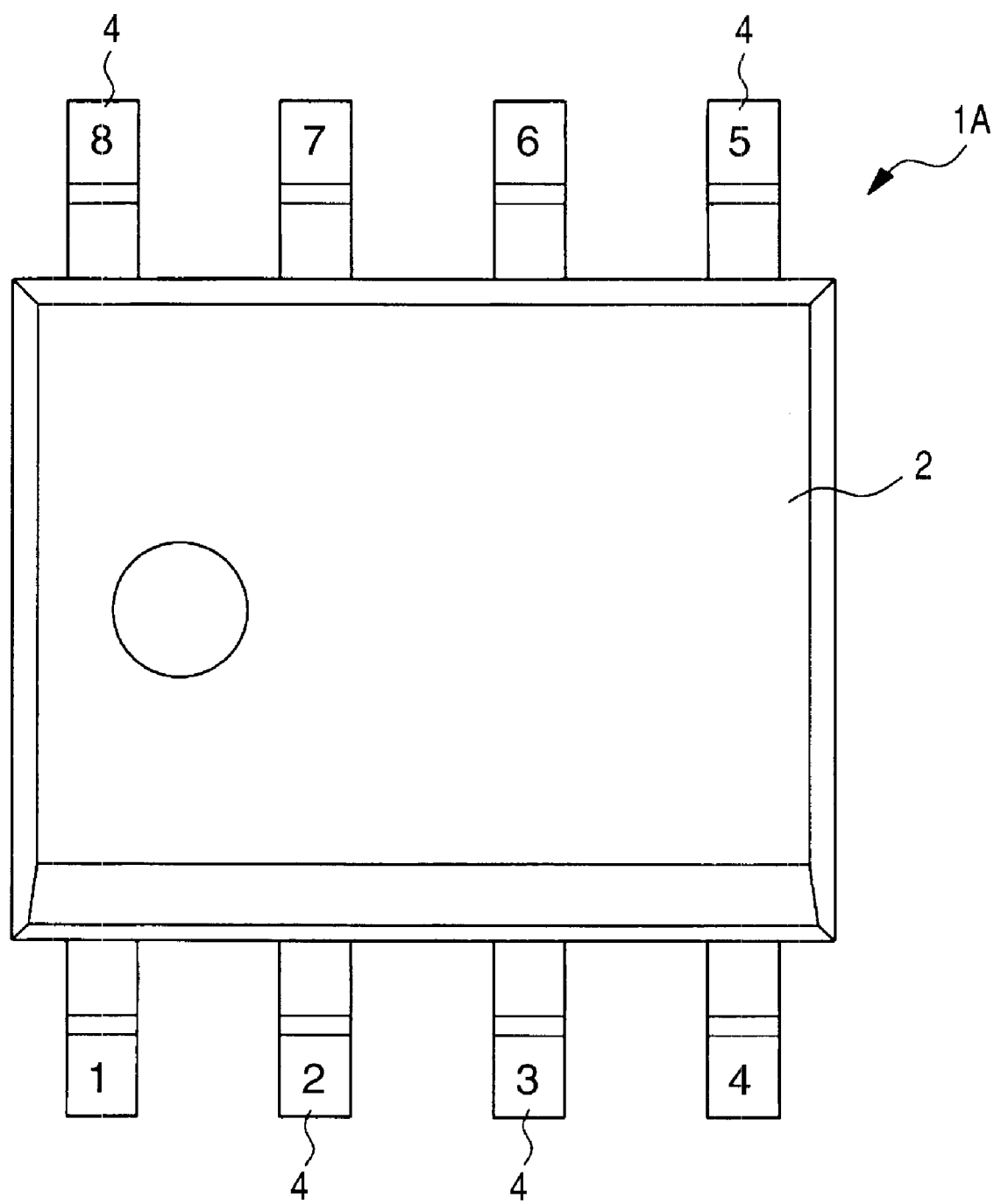
FIG. 1 is a plan view illustrating the appearance of a semiconductor device according to Embodiment 1 of the present invention.

The embodiments of the present invention will hereinafter be described specifically based on drawings. In all the drawings for illustrating the embodiments of the present invention, members having the same function will be identified by the same reference numerals, and overlapping descriptions will be omitted. In the drawings which will be used for illustrating the embodiments of the present invention, even a plan view is sometimes hatched in order to facilitate understanding of its constitution.

Embodiment 1

Figure 2:
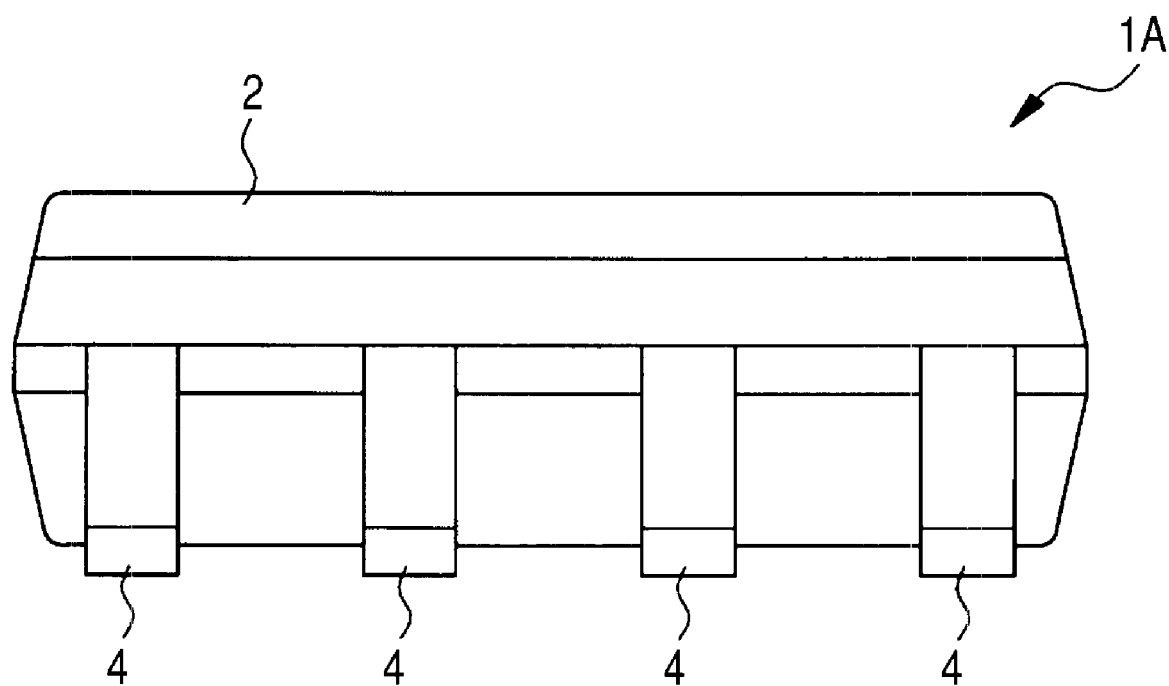
FIG. 2 is a side view illustrating the appearance of the semiconductor device according to Embodiment 1 of the present invention.
Figure 3:
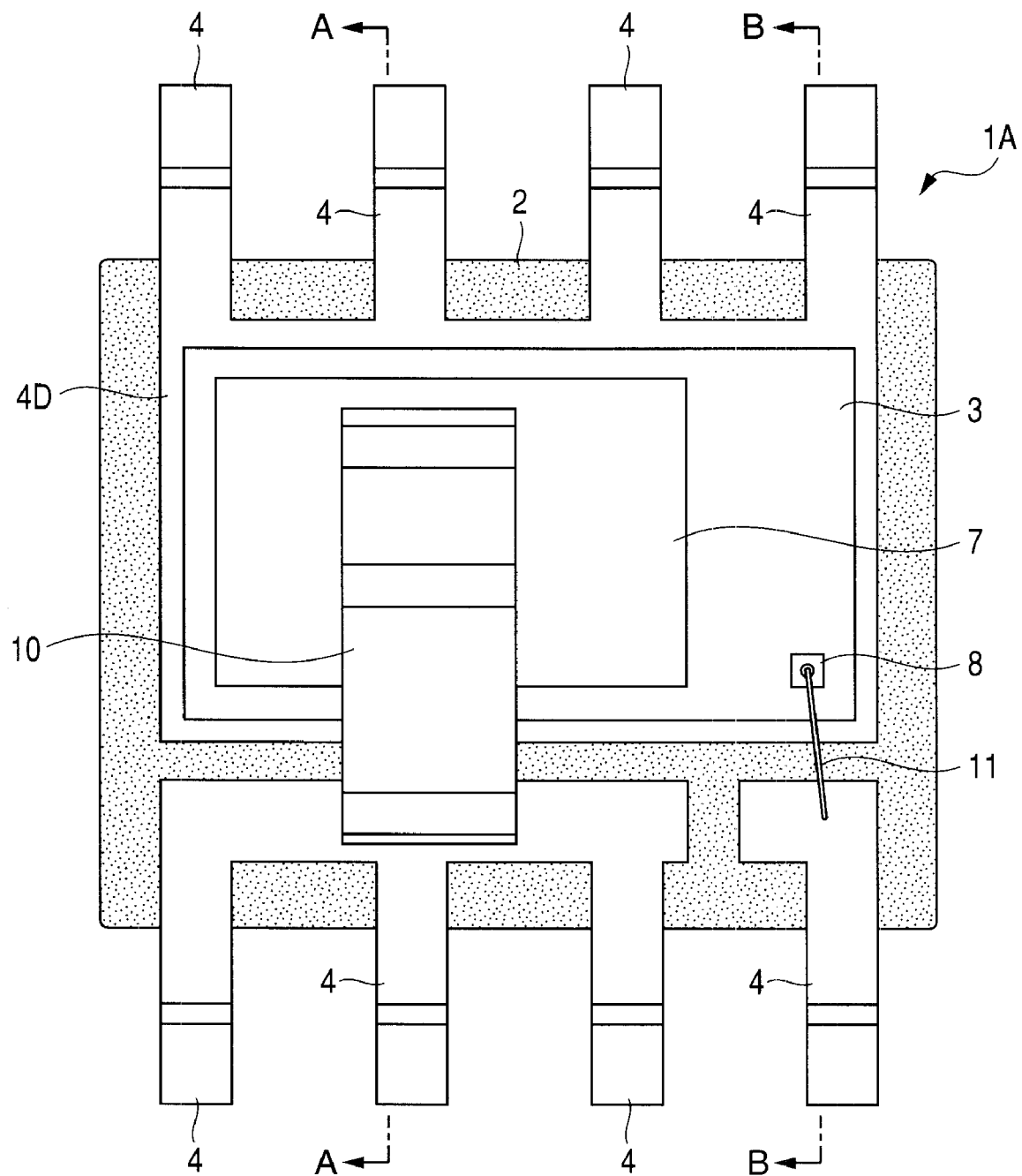
FIG. 3 is a plan view illustrating the inner structure of the semiconductor device according to Embodiment 1 of the present invention.
Figure 4:
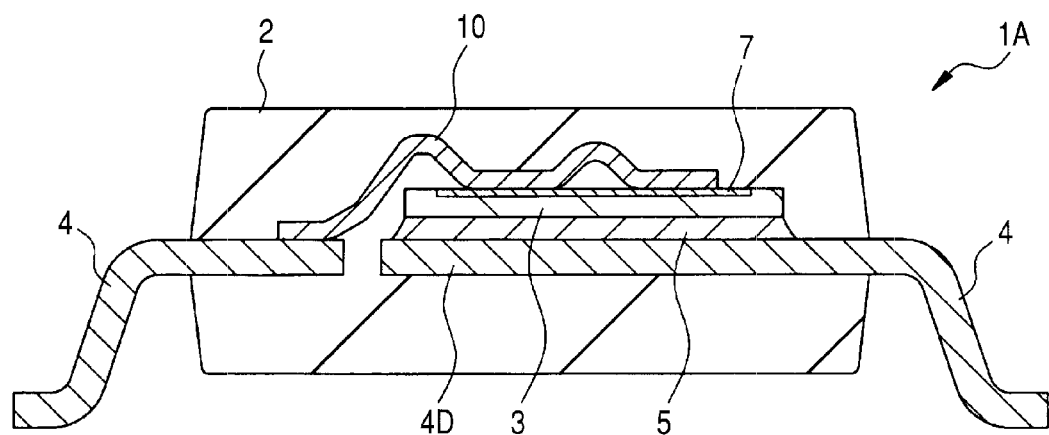
FIG. 4 is a cross-sectional view taken along a line A-A of FIG. 3.
Figure 5:
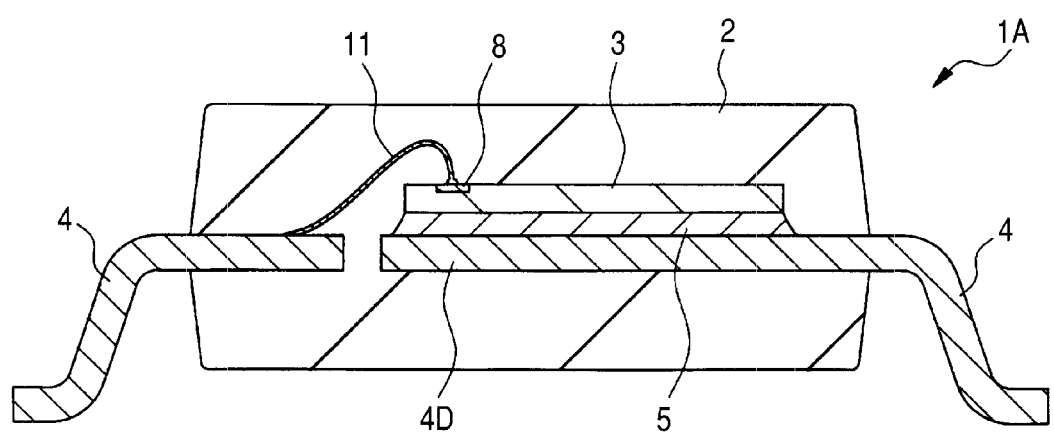
FIG. 5 is a cross-sectional view taken along a line B-B of FIG. 3.

FIGS. 1 to 5 illustrate a semiconductor device according to this Embodiment, in which FIG. 1 is a plain view of the appearance, FIG. 2 is a side view of the appearance, FIG. 3 is a plan view of the inner structure, FIG. 4 is a cross-sectional view taken along a line A-A of FIG. 3, and FIG. 5 is a cross-sectional view taken along a line B-B of FIG. 3.

A semiconductor device 1A of this Embodiment is applied to SOP8 which is a kind of a small surface mounted package. An outer lead portion of each of eight leads 4 configuring an external connection terminal of SOP8 is exposed outside a molding resin 2 made of an epoxy resin. Of the leads 4 shown in FIG. 1, the first to third leads are source leads, the fourth lead is a gate lead, and the fifth to eighth leads are drain leads.

Inside the molding resin 2, a silicon chip 3 having thereon a power MOSFET, which will be described later, is sealed. This power MOSFET is used, for example, a power control switch or a charge/discharge protection circuit of a portable information device. The silicon chip 3 has a planar shape of, for example, 3.9 mm (long side)×2.2 mm (short side).

The silicon chip 3 is mounted on a die pad portion 4D integrated with the four leads 4 (the fifth to eighth leads) forming the drain leads, with its main surface up. The backside of the silicon chip 3 forms the drain of the power MOSFET and is bonded to the upper surface of the die pad portion 4D via an Ag paste 5. The die pad portion 4D and the eight leads 4 (first lead to eighth lead) are made of Cu or an Fe—Ni alloy and they have, on the surfaces thereof, a three layered (Ni/Pd/Au) plated layer (not illustrated) obtained by stacking an Ni film and an Au film over and below a Pd film serving as a main component, respectively. The effect of the plated layer comprised mainly of the Pd film will be described later.

A source pad (source electrode) 7 and a gate pad 8 are formed over the main surface of the silicon chip 3. The source pad 7 and the gate pad 8 are made of a conductive film formed as the uppermost layer of the silicon chip 3 and comprised mainly of an Al film. The source pad 7 has a wider area than the gate pad 8 in order to reduce the on-resistance of the power MOSFET. Because of a similar reason, the entire backside of the silicon chip 3 forms the drain of the power MOSFET.

In the semiconductor device 1A of this Embodiment, three leads 4 (first to third leads) forming the source leads are coupled to each other inside the molding resin 2. The coupled portion and the source pad 7 are electrically coupled via an Al ribbon 10. The Al ribbon 10 has a thickness of about 0.1 mm and a width of about 1 mm. For reducing the on-resistance of the power MOSFET, it is preferred to bring the width of the Al ribbon 10 close to the width of the source pad 7, thereby increasing the contact area between the Al ribbon 10 and the source pad 7. The lead 4 (fourth lead) which forms the gate lead and the gate pad 8 are electrically coupled via an Au wire 11.

Figure 6:
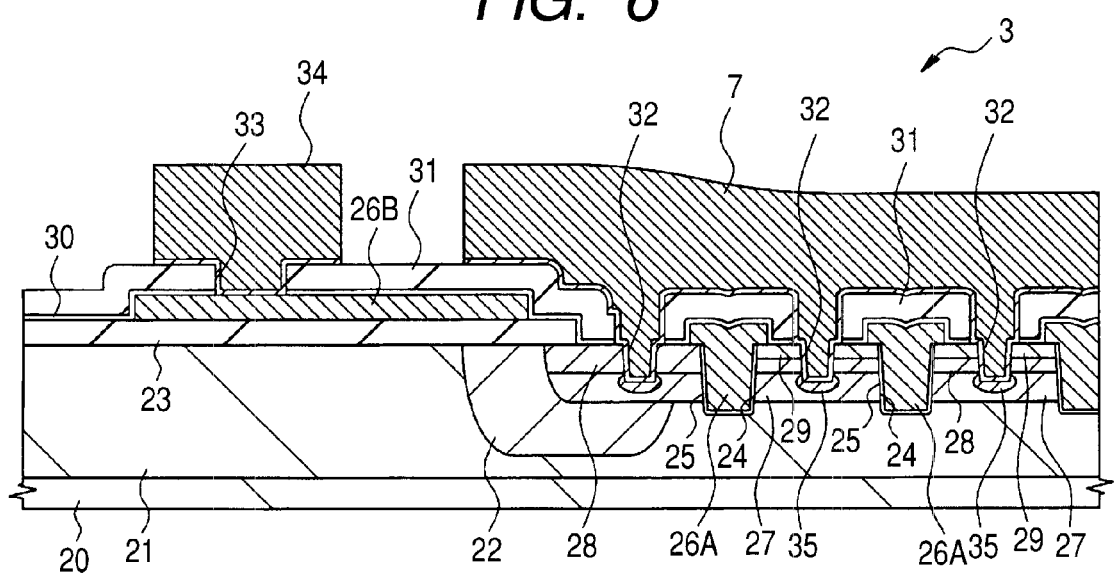
FIG. 6 is a fragmentary cross-sectional view illustrating a power MOSFET formed on a silicon chip.

The power MOSFET formed on the silicon ship 3 will next be described. FIG. 6 is a fragmentary cross-sectional view of the silicon chip 3 showing an n-channel trench gate power MOSFET as one example of power MOSFETs.

An $n^+$ type single crystal silicon substrate 20 has, on the main surface thereof, an $n^-$ type single crystal silicon layer 21 formed by epitaxial growth. The $n^+$ type single crystal silicon substrate 20 and $n^-$ type single crystal silicon layer 21 configure the drain of the power MOSFET.

A p well 22 is formed in a portion of the $n^-$ type single crystal silicon layer 21. A silicon oxide film 23 is formed over a portion of the surface of the $n^-$ type single crystal silicon layer 21, while a plurality of trenches 24 are formed in the other portion of the $n^-$ type single crystal silicon layer 21. A region of the $n^-$ type single crystal silicon layer 21 covered with the silicon oxide film 23 configures an element isolation region, while a region having the trenches 24 formed therein configures an element formation region (active region). The trenches 24 have, though not illustrated, a polygonal planar shape, for example, square, hexagonal or octagonal shape, or a striped shape extending in one direction.

Each of the trenches 24 has, on the bottom and side surfaces thereof, a silicon oxide film 25 configuring a gate oxide film of the power MOSFET. The trenches 24 are filled with a polycrystalline silicon film 26A configuring a gate electrode of the power MOSFET. On the other hand, the silicon oxide film 23 has, thereover, a gate lead electrode 26B made of a polycrystalline film deposited in the same step as that of the polycrystalline silicon film 26A configuring the gate electrode. The gate electrode (polycrystalline silicon film 26A) and the gate lead electrode 26B are electrically coupled in an unillustrated region.

In the $n^-$ type single crystal silicon layer 21 of the element formation region, a $p^-$ type semiconductor region 27 shallower than the trench 24 is formed. This $p^-$ type semiconductor region 27 configures the channel layer of the power MOSFET. The $p^-$ type semiconductor region 27 has, thereover, a p type semiconductor region 28 having a higher impurity concentration than that the $p^-$ type semiconductor region 27 and the p type semiconductor region 28 has, thereover, an $n^+$ type semiconductor region 29. The p type semiconductor region 28 configures a punch-through stopper layer of the power MOSFET, while the $n^+$ type semiconductor region 29 configures the source of it.

Over the element formation region in which the power MOSFET has been formed and over the element isolation region in which the gate lead electrode 26B has been formed, silicon oxide films 30 and 31 are formed as two layers. In the element formation region, a connecting hole 32 penetrating through the silicon oxide films 31 and 30, p type semiconductor region 28 and $n^+$ type semiconductor region 29 and reaching the $p^-$ type semiconductor region 27 is formed. In the element isolation region, a connecting hole 33 penetrating through the silicon oxide films 31 and 30 and reaching the gate lead electrode 26B is formed.

Over the silicon oxide film 31 including the insides of the connecting holes 32 and 33, a source pad 7 and a gate interconnect 34, each made of a film stack of a thin TiW (titanium tungsten) film and a thick Al film are formed. The source pad 7 formed in the element formation region is electrically coupled to the source ($n^+$ type semiconductor region 29) of the power MOSFET via the connecting hole 32. The connecting hole 32 has, on the bottom thereof, a $p^+$ type semiconductor region 35 for bringing the source pad 7 into an ohmic contact with the $p^-$ type semiconductor region 27. The gate interconnect 34 formed in the element isolation region is coupled to the gate electrode (polycrystalline silicon film 26A) of the power MOSFET via the gate lead electrode 26B below the connecting hole 33.

To the source pad 7, one end of the Al ribbon 10 is electrically coupled by the wedge bonding method. The source pad 7 has preferably a thickness of 3 μm or greater over the silicon oxide films 31 and 30 in order to relax an impact on the power MOSFET when the Al ribbon 10 is bonded.

Figure 7:
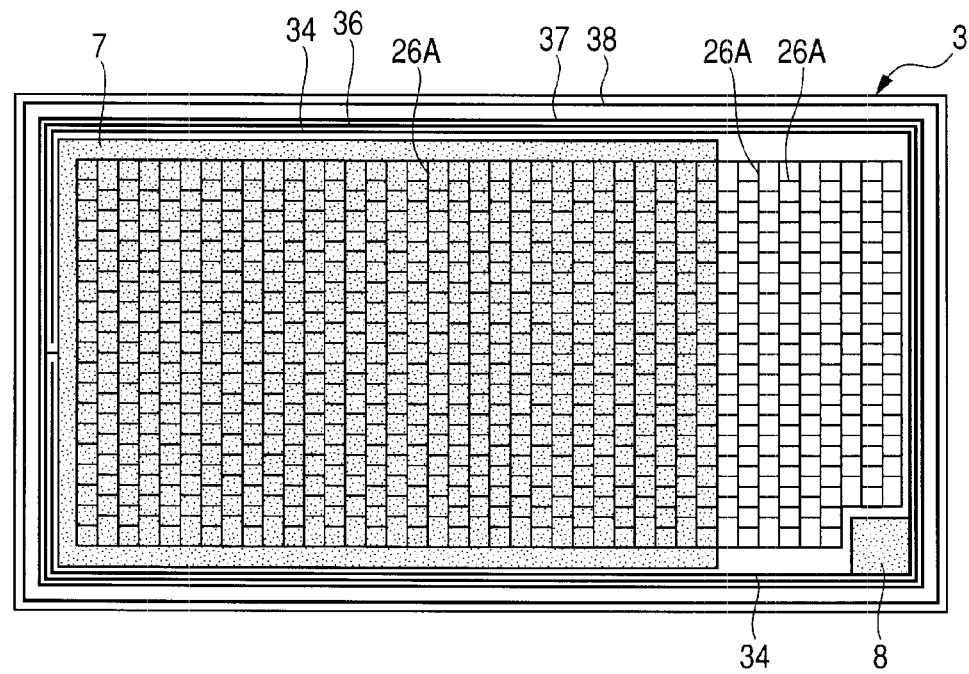
FIG. 7 is a plan view illustrating a conductive film of the uppermost layer including a source pad, gate pad and gate interconnect formed over the silicon chip and a gate electrode lying below the conductive film.

FIG. 7 is a plan view illustrating a conductive film as the uppermost layer including the source pad 7, gate pad 8 and gate interconnect 34 formed over the silicon chip 3 and the gate electrode (polycrystalline silicon film 26A) formed therebelow. The gate interconnect 34 is electrically coupled to the gate pad 8, while the source pad 7 is electrically coupled to an Al interconnect 36. The silicon chip 3 has, at the periphery thereof, Al interconnects 37 and 38. The gate pad 8 and Al interconnects 36, 37, and 38 are made of a conductive film (a stack of a TiW film and an Al film) lying in the same layer as the conductive film of the source pad 7 and gate interconnect 34. In the actual silicon chip 3, the gate interconnect 34 and the Al interconnects 36, 37 and 38 are covered with a surface protective film, which is not illustrated, so that of the uppermost conductive films, only the source pad 7 and gate pad 8 are exposed from the surface of the silicon chip 3. It should be noted that in the example shown in FIG. 7, the trench 24 in which the gate electrode (polycrystalline silicon film 26A) is formed has a square planar shape so that the gate electrode (polycrystalline silicon film 26A) has a square planar shape.

Figure 8:
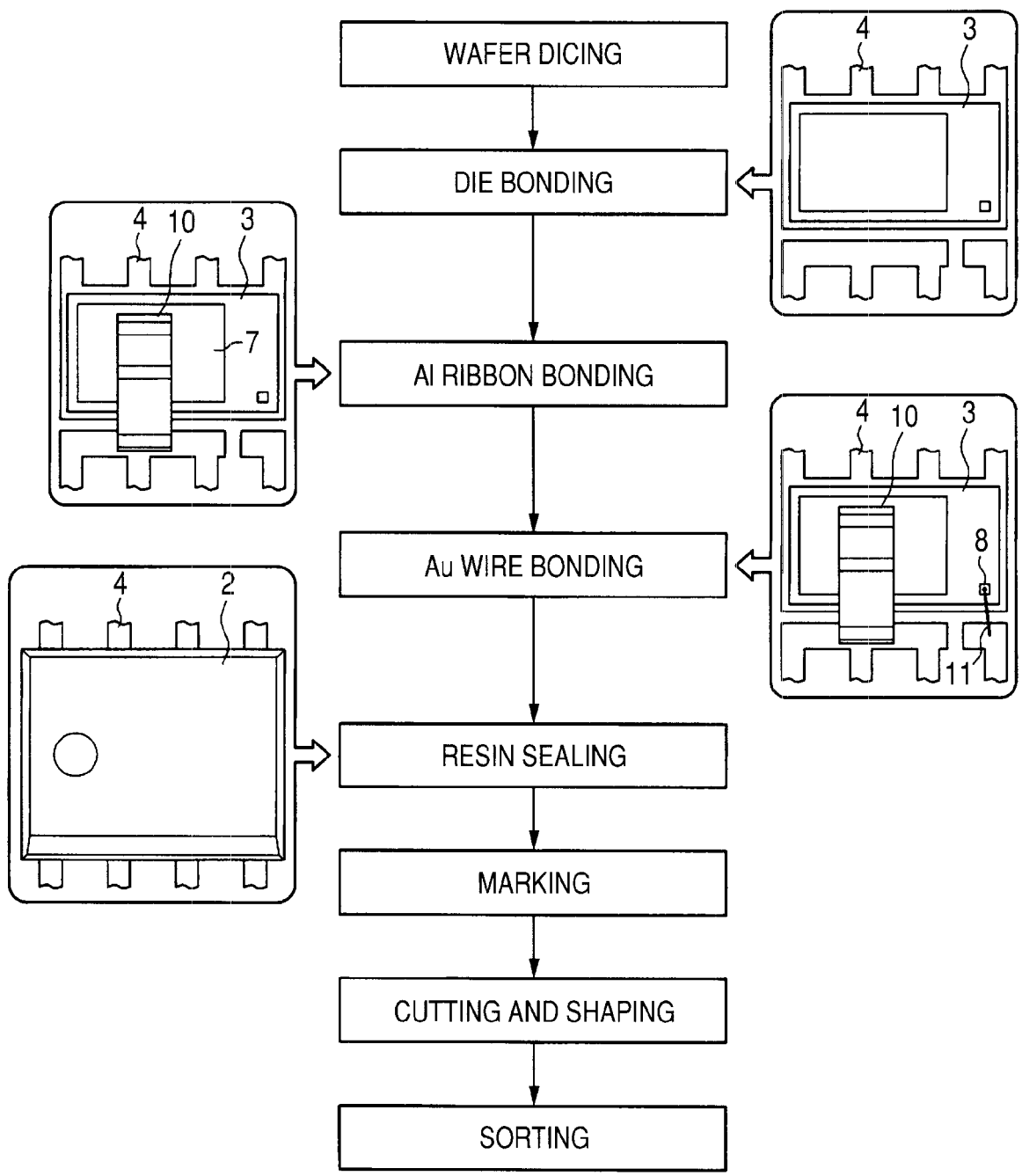
FIG. 8 is a flow chart showing one example of manufacturing steps of the semiconductor device according to Embodiment 1 of the present invention.

FIG. 8 is a flow chart showing one example of manufacturing steps of the semiconductor device 1A of this Embodiment. Manufacture of the semiconductor device 1A starts with the formation of a power MOSFET on a silicon wafer in accordance with a known manufacturing method. The silicon wafer is then diced into a silicon chip 3. A lead frame having leads 4 and die pad portion 4D formed therein are prepared. The silicon chip 3 is mounted (die-bonded) onto the die pad portion 4D by using an Ag paste 5.

An Al ribbon 10 is bonded between a source pad 7 of the silicon chip 3 and a lead 4 (a portion in which first to third leads have been integrated with each other) configuring the source leads by the known wedge bonding method utilizing ultrasonic waves. Then, an Au wire 11 is bonded between a gate pad 8 of the silicon chip 3 and a lead 4 (fourth lead) configuring the gate lead by the known ball bonding method utilizing heat and ultrasonic waves. The bonding of the Al ribbon 10 and the bonding of the Au wire 11 may be performed in any order.

By using a mold, the silicon chip 3 (and die pad portion 4D, Al ribbon 10, Au wire 11 and inner lead portions of the leads 4) is sealed with a molding resin 2. The surface of the molding resin 2 is then marked with a product name, production number, and the like. After unnecessary portions of the leads 4 exposed outside of the molding resin 2 are cut and removed, the leads 4 are formed into a gull-wing shape. After a sorting step for discriminating the good products from defective products, the semiconductor device 1A is completed.

Figure 9:
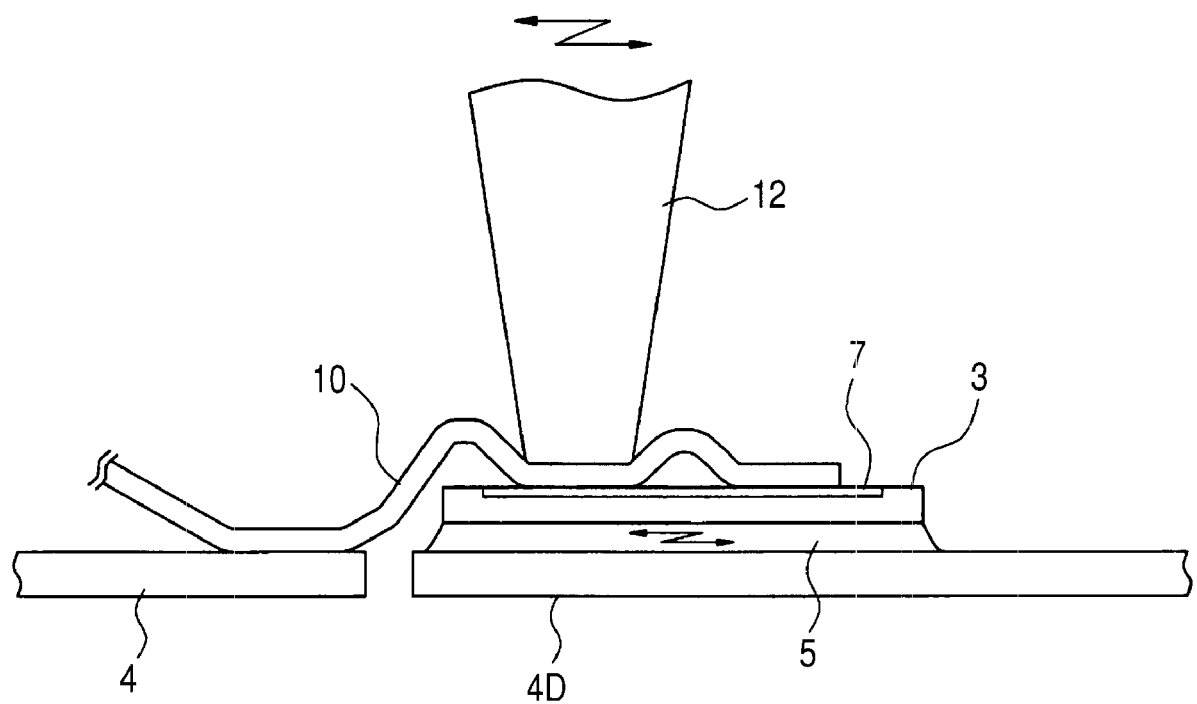
FIG. 9 shows the way how oscillation energy is added to an Ag paste when an Al ribbon is wedge-bonded to the source pad of the silicon chip.

In this Embodiment, the Al ribbon 10 having a wider area than the Au wire 11 is used as a conductive material for electrically coupling the source pad 7 having a wider area than the gate pad 8 to the source lead (lead 4). When the Al ribbon 10 is wedge-bonded to the surface of the source pad, large oscillation energy of a bonding tool 12 is added not only to the surface of the silicon chip 3 but also to the Ag paste 5 present between the silicon chip 3 and die pad portion 4D, as illustrated in FIG. 9. It is therefore desired to selectively use the Ag paste 5 having an optimum elastic modulus (Pa) as a countermeasure against the generation of cracks in the Ag paste 5 due to the large oscillation energy of the bonding tool.

In this Embodiment, the elastic modulus (Pa) of the Ag paste 5 is defined by the following formula (1):

Elastic modulus(Pa)=2.6×adhesion thickness(μm)/ displacement at rupture(μm)×shear strength(Pa)  (1)

In the formula (1), the adhesion thickness is the thickness (μm) of the Ag paste and the shear strength (Pa) is the force in the shear direction/cross-sectional area (adhesion area). The displacement at rupture (μm) is derived from the calculation formula shown in FIG. 10. Since the following inequality: displacement at rupture>displacement permitting ultrasonic bonding of Al ribbon (an amount of displacement of an Ag paste caused by oscillation of a bonding tool during ultrasonic bonding of the Al ribbon) holds, the selection guideline formula of the elastic modulus (Pa) required of the Ag paste 5 of this Embodiment leads to {elastic modulus (PA)<2.6×adhesion thickness(μm)/displacement(μm) permitting ultrasonic bonding of Al ribbon×shear strength(Pa)}.

A crack resistance test performed to confirm the validity of the selection guideline formula will next be described. The elastic modulus, shear strength and adhesion thickness of each of four commercially-available Ag pastes ((1) to (4)) used in the test are shown in Table 1. The displacement amount of each of the Ag pastes (1), (3) and (4) during ultrasonic bonding of an Al ribbon is 0.1218 mm, while that of the Ag paste (2) is 0.07 mm.

TABLE 1

|  | Elastic modulus | Shear strength | Adhesion thickness |
|---|---|---|---|
| Ag paste (1) | 5.30 GPa | 15.5 MPa | 15.4 μm |
| Ag paste (2) | 5.34 GPa | 8.6 MPa | 13.2 μm |
| Ag paste (3) | 2.42 GPa | 14.2 MPa | 24.4 μm |
| Ag paste (4) | 0.611 GPa | 3.8 MPa | 16.6 μm |

Figure 11:
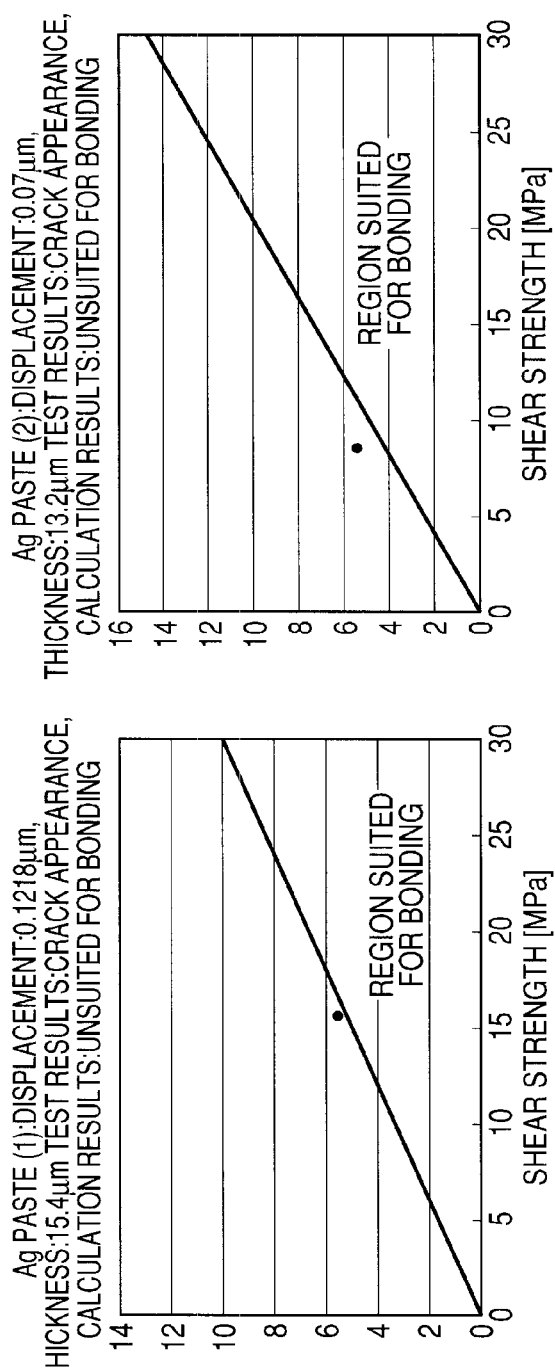
FIG. 11 is a graph showing the results of the crack resistance test of four Ag pastes to confirm the validity of the selection guideline formula.

FIG. 11 is a graph showing the test results of four Ag pastes ((1) to (4)) to confirm the validity of the selection guideline formula. The solid line in each graph shows the elastic modulus of each of the Ag pastes ((1) to (4)) calculated from the formula (1).

A region below the solid line is a region satisfying the selection guideline formula, that is, a bondable region. A black dot in each graph shows the actual elastic modulus of each of the Ag pastes ((1) to (4)).

According to the test results, the Ag pastes ((3) and (4)) whose actual elastic modulus satisfied the selection guideline formula were not cracked, while the Ag pastes ((1) and (2)) which did not satisfy the selection guideline formula were cracked. It has therefore been confirmed from the test results that cracks of the Ag paste 5, which will otherwise occur due to oscillation energy of the bonding tool, can be effectively avoided by selecting the Ag paste 5 satisfying the above selection guideline formula.

Figure 12:
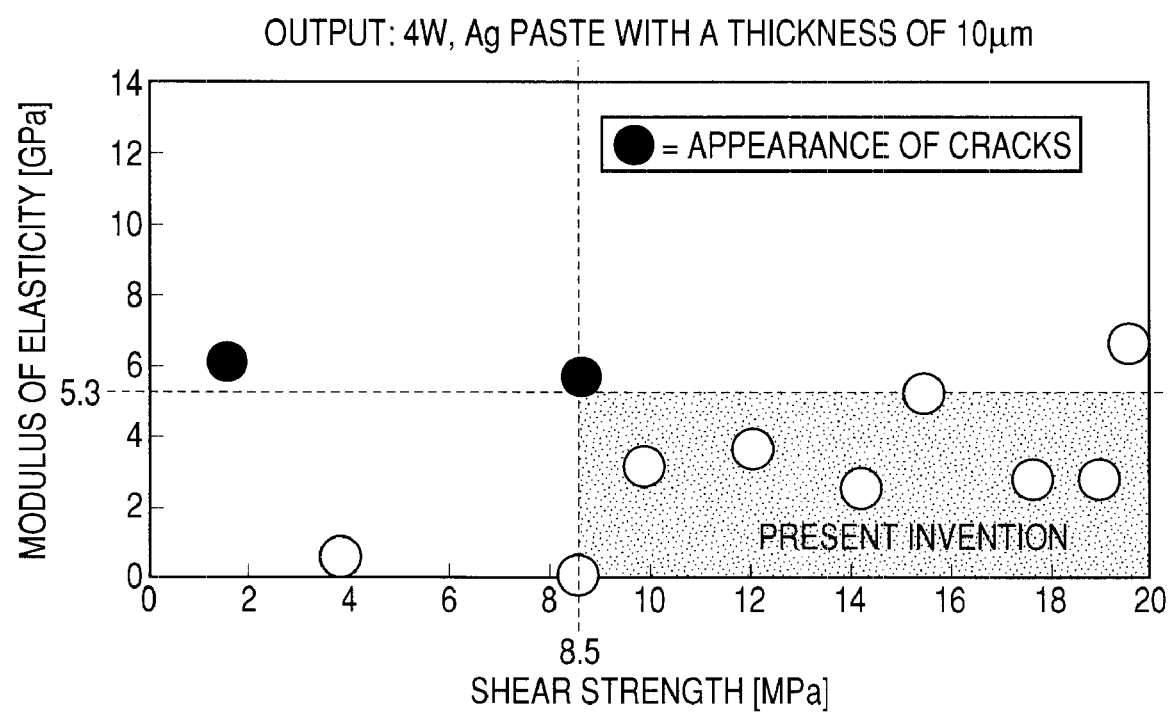
FIG. 12 is a graph showing the measurement results of dependence of the elastic modulus of the Ag paste on shear strength.

FIG. 12 is a graph showing the measurement results of the shear strength dependence of the elastic modulus of an Ag paste when the thickness of the Ag paste is set at 10 μm and the Al ribbon is bonded at a standard ultrasonic bonding output (4 W). The open circle in the graph shows an example where no cracks appeared, while the black circle shows an example where cracks appeared.

These measurement results show that the elastic modulus of an Ag paste is preferably within a range of from 0.2 to 5.3 GPa and the shear strength (MPa) is preferably 8.5 MPa or greater. When the elastic modulus is less than 0.2 GPa, a desired electric conductivity cannot be attained owing to an excessively small Ag content. When the elastic modulus exceeds 5.3 GPa, on the other hand, cracks appear because too high hardness prevents the Ag paste from deforming and following the oscillation movement during the ultrasonic bonding. When the Ag paste has shear strength less than 8.5 MPa, it cannot endure the impact which has occurred during ultrasonic bonding.

The effect of forming a plated layer comprised mainly of a Pd film on the surface of the lead frame (die pad portion 4D and leads 4) will next be described. Table 2 shows the adhesion (A means good adhesion, while B means poor adhesion) between the source leads and Al ribbon, the gate lead and Au wire, and the die pad portion and Ag paste in two cases, that is, a case where each of three (Ag, Ni, Pd) plated layers is formed on the surface of a lead frame made of Cu and a case (Cu bare) where no plated layer is formed.

TABLE 2

Table 2
Source: Al ribbon, gate: Au wire, Die bonding material: Ag paste

|  | Plating material | | | |
| --- | --- | --- | --- | --- |
|  | Ag | Ni | Pd | Cu bare |
| Source post-Al ribbon coupling | B | A | A | A |
| Gate post-Au wire coupling | A | B | A | B |
| Die pad-Ag paste coupling | A | B | A | B |

As is apparent from Table 2, when the plated layer comprised mainly of a Pd film is formed on the surface of the lead frame, any combination of the source leads and Al ribbon, the gate lead and Au wire, and the die pad portion and Ag paste show good adhesion.

TABLE 3

Source: Al ribbon, gate: Al wire, die bonding material: Ag paste

|  | Plating material | | | |
| --- | --- | --- | --- | --- |
|  | Ag | Ni | Pd | Cu bare |
| Source post-Al ribbon coupling | B | A | A | A |
| Gate post-Au wire coupling | A | A | A | A |
| Die pad-Ag paste coupling | A | B | A | B |

As is apparent from Table 3, when the plated layer comprised mainly of a Pd film is formed on the surface of the lead frame, even coupling between the gate pad and gate lead with an Al wire shows good adhesion. Thus, formation of a plated layer comprised mainly of a Pd film on the surface of the lead frame enables coupling of any combination with only one plating material, leading to simplification of the manufacturing step.

According to this Embodiment, by coupling the leads 4 configuring the source leads to the source pad 7 with the Al ribbon 10, a bonding area can be made greater compared with the coupling between the leads 4 and source pad 7 with an Au wire, which enables a reduction in the resistance of the semiconductor device 1A. In addition, since the cost of the Al ribbon 10 is lower that of the Au wire, a manufacturing cost of the semiconductor device 1A can be reduced further. When resistances required of these couplings are equal, the size of the source pad and therefore that of the silicon chip 3 can be decreased compared with the coupling between the leads 4 and the source pad 7 with an Au wire so that it is also possible to reduce the manufacturing cost of the semiconductor device 1A.

This Embodiment enables improvement of both a production yield and reliability of the semiconductor device 1A, because cracks of the Ag paste 5, which will otherwise occur by ultrasonic bonding of the Al ribbon 10, can be prevented by optimizing the elastic modulus and shear strength of the Ag paste 5.

This Embodiment enables realization of elimination of Pb from the semiconductor device 1A by forming a plated layer comprised mainly of a Pd film on the surface of the lead frame (die pad portion 4D and lead 4).

Embodiment 2

Figure 13:
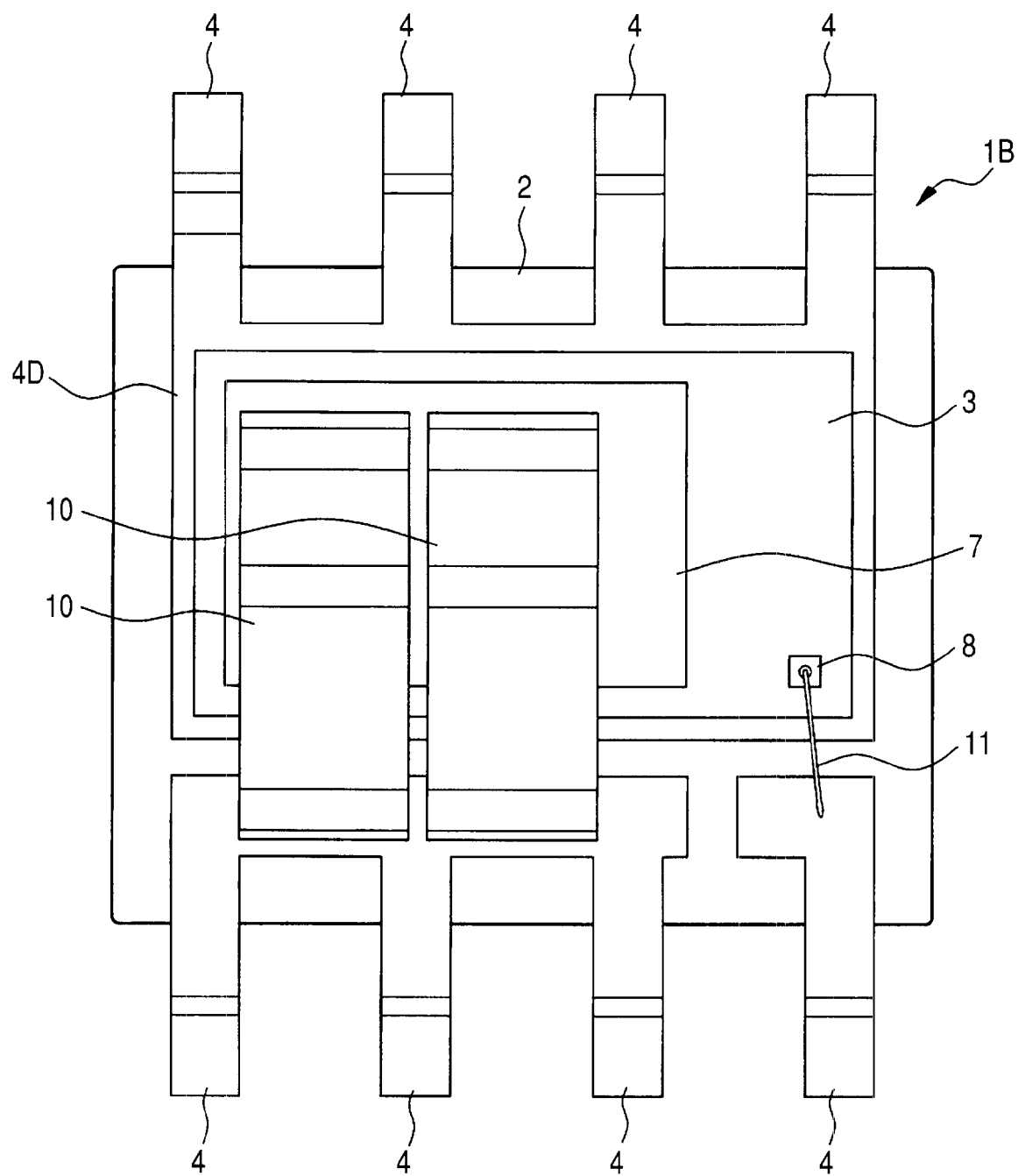
FIG. 13 is a plan view illustrating the inner structure of a semiconductor device according to Embodiment 2.

FIG. 13 is a plan view illustrating the inner structure of a semiconductor device (SOP8) according to this Embodiment. The semiconductor device 1B of this Embodiment is characterized in that three leads 4 (first to third leads) configuring a source lead are electrically coupled to the source pad 7 with a plurality of Al ribbons 10. Although no particular limitation is imposed on the number of the Al ribbons 10 to be coupled to the source pad 7, a coupling example using two Al ribbons 10 is shown in FIG. 13.

Semiconductor devices (SOP8) differ in the size of the silicon chip 3, depending on its type or generation. The area of the source pad 7 varies in accordance with the size of the silicon chip. When plural kinds of Al ribbons 10 different in width must be employed for manufacture of such semiconductor devices, it is very cumbersome to manage these Al ribbons 10. On the other hand, the Al ribbons 10 can be managed more easily and simply when only one kind of the Al ribbon 10 having a relatively narrow width is employed and the number of the Al ribbons 10 used for coupling is changed depending on the area of the source pad 7.

Figure 14:
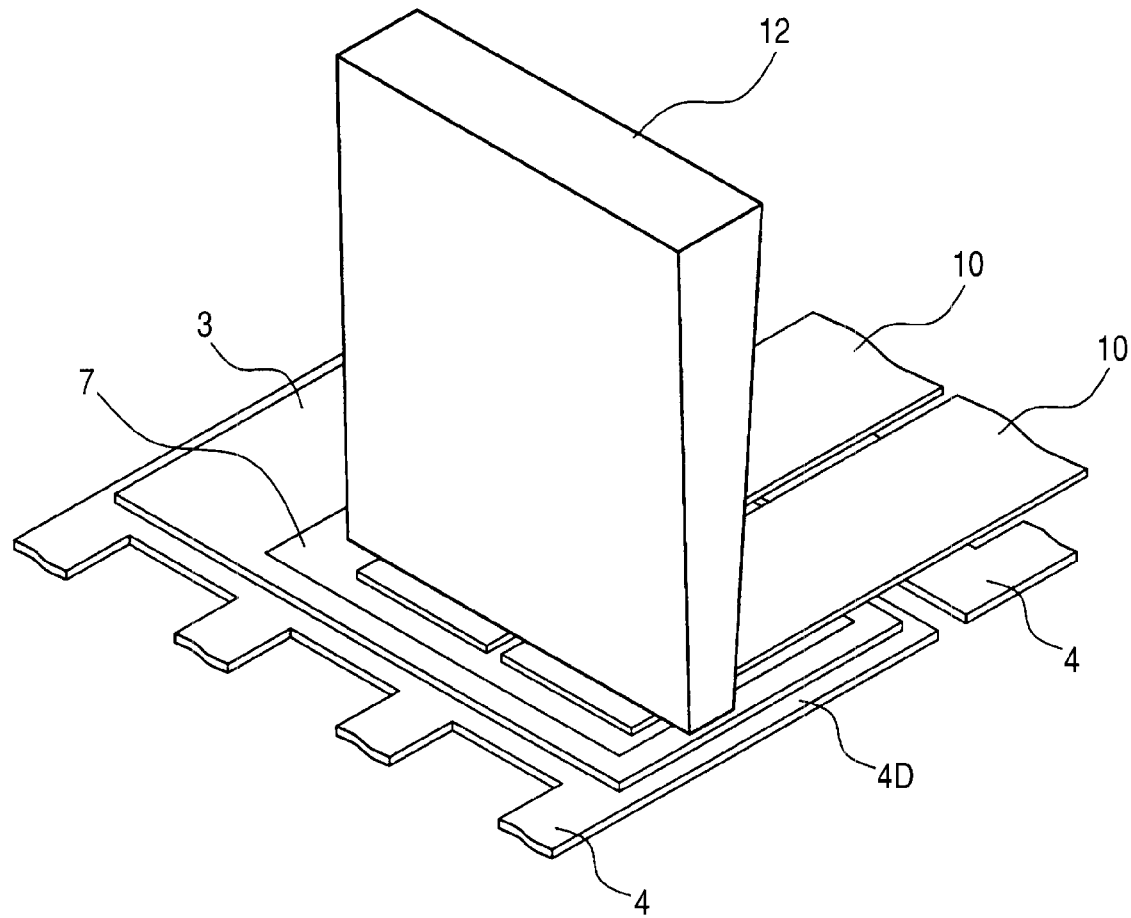
FIG. 14 is a fragmentary perspective view showing a step of bonding a plurality of Al ribbons simultaneously by using a bonding tool.

For coupling of the plural Al ribbons 10 to the source pad 7, simultaneous bonding of the plural Al ribbons 10 by using one bonding tool 12 as illustrated in FIG. 14 enables efficient bonding.

Since the bonding area becomes greater by coupling the leads 4 configuring the source leads to the source pad 7 with the plural Al ribbons 10, a reduction in the resistance of the semiconductor device 1B can be promoted.

Embodiment 3

Figure 15:
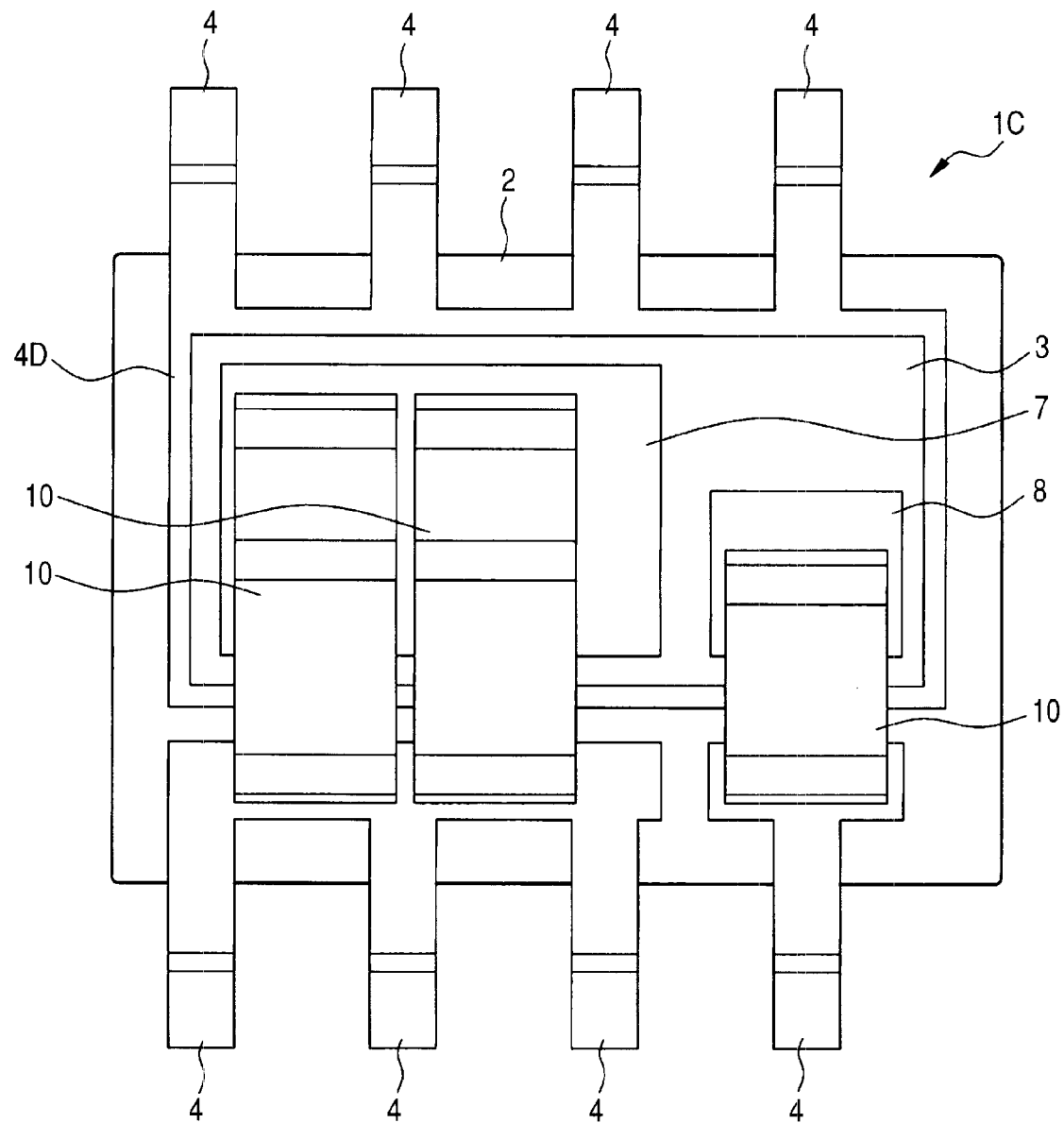
FIG. 15 is a plan view illustrating an inner structure of a semiconductor device according to Embodiment 3 of the present invention.

FIG. 15 is a plan view illustrating the inner structure of a semiconductor deice (SOP8) 1C of this Embodiment. The semiconductor device 1C of this Embodiment is characterized in that the area of a gate pad 8 to be formed on the main surface of the silicon chip 3 is enlarged and not only the source pad 7 and leads 4 but also the gate pad 8 and lead 4 (gate lead) are coupled with the Al ribbon 10.

According to this Embodiment, the manufacturing step can be simplified compared with coupling between the gate pad 8 and the lead 4 with the Au wire 11.

Embodiment 4

Figure 16:
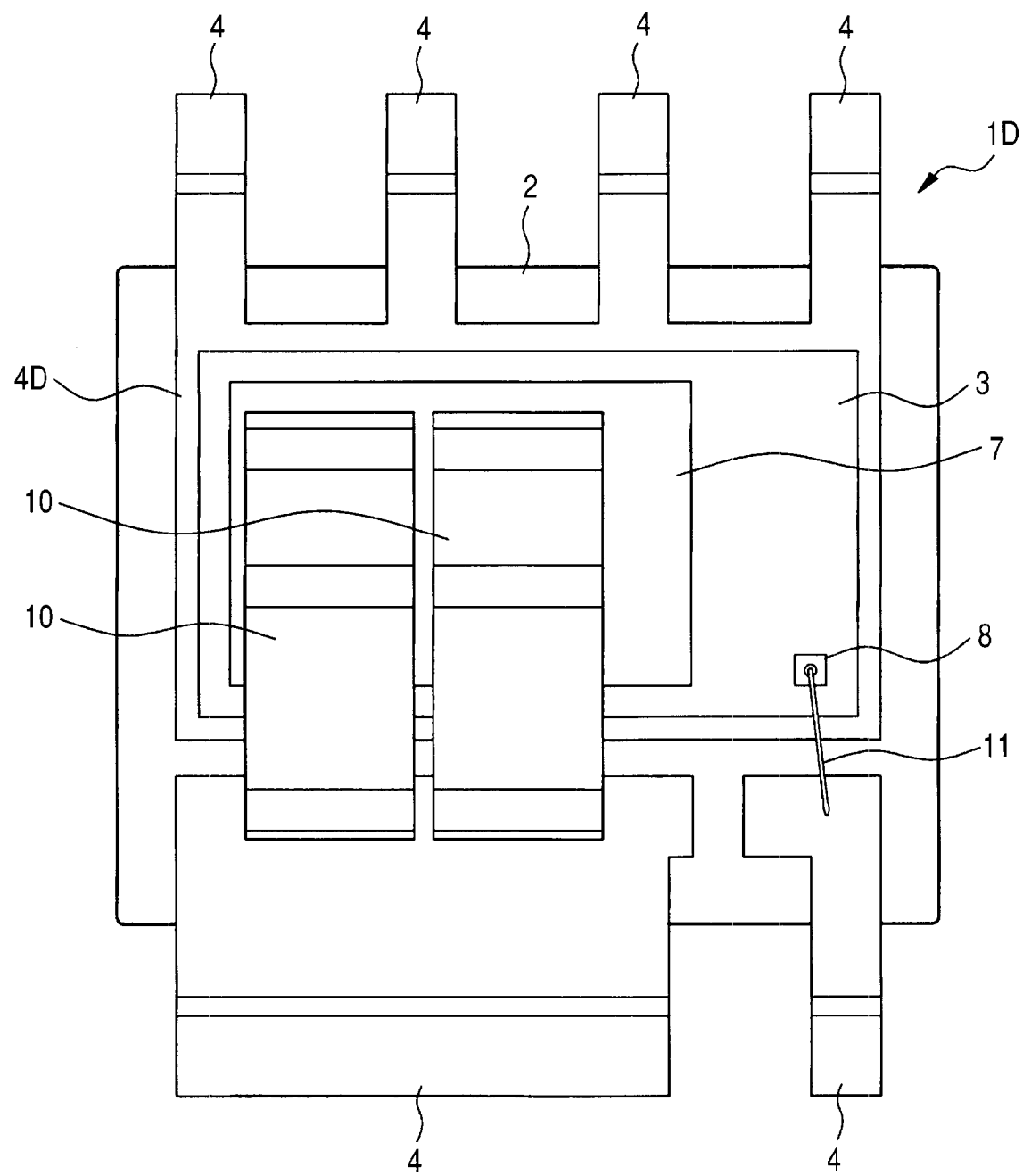
FIG. 16 is a plan view illustrating an inner structure of a semiconductor device according to Embodiment 4 of the present invention.

FIG. 16 is a plan view illustrating the inner structure of a semiconductor device (SOP8) 1D according to this Embodiment. The semiconductor device 1D of this Embodiment is characterized in that among the leads 4 exposed outside the molding resin 2, the source lead is made of a single wide lead.

In this Embodiment, an increase in the width of the source lead enables a further reduction of the on-resistance. In addition, by making the width of the lead 4 exposed outside the molding resin 2 wider, the semiconductor device 1D having a small thermal resistance can be obtained owing to improvement in the heat radiation property.

Embodiment 5

Figure 17:
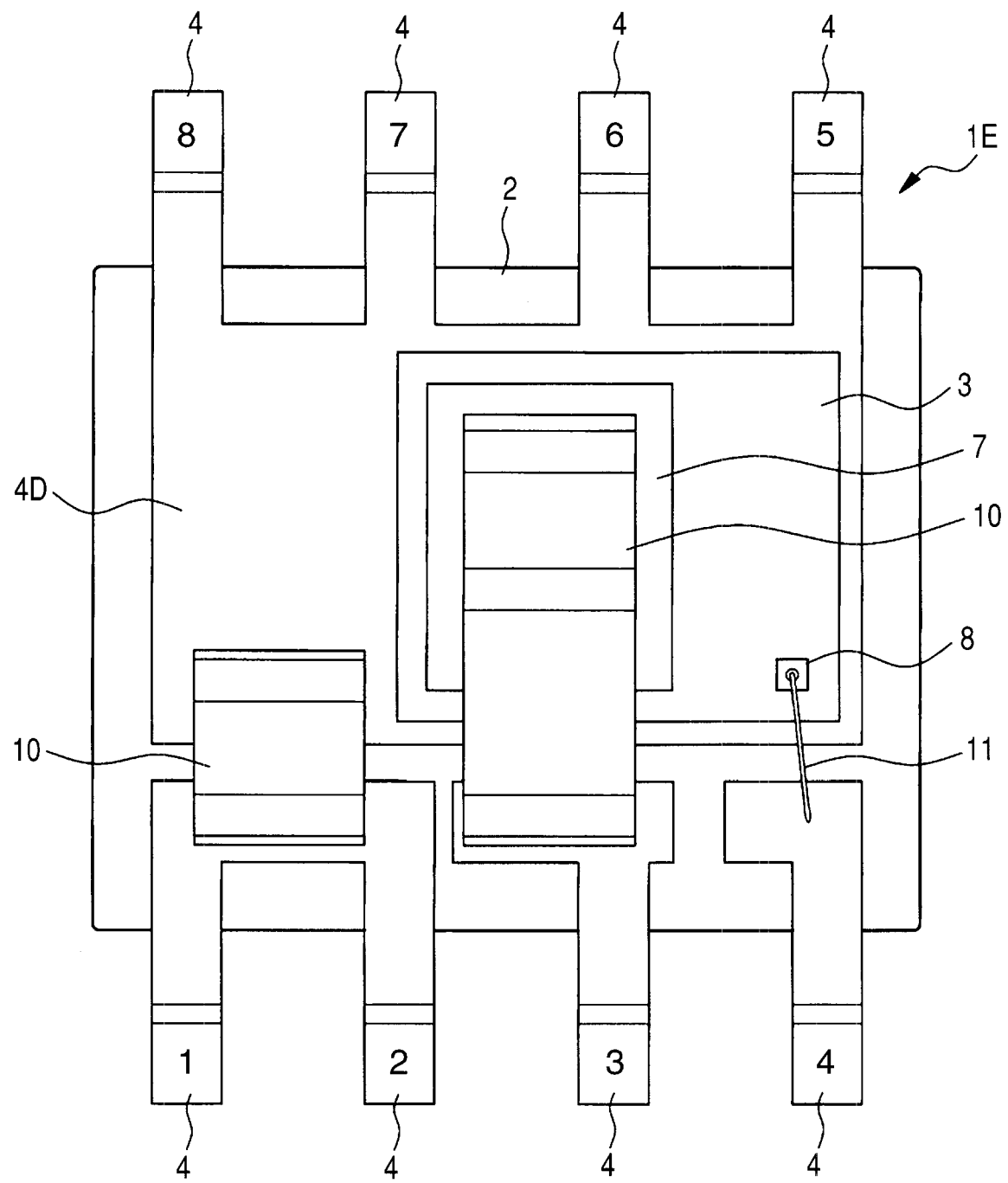
FIG. 17 is a plan view illustrating an inner structure of a semiconductor device according to Embodiment 5 of the present invention.

FIG. 17 is a plan view illustrating the inner structure of a semiconductor device (SOP8) 1E according to this Embodiment. The semiconductor device 1E of this Embodiment is characterized in that the die pad portion 4d and the leads 4

(first and second leads) are coupled with the Al ribbon 10. In this case, the first lead, second lead, and fifth to eighth leads serve as drain leads, the third lead serves as a source lead, and the fourth lead serves as a gate lead.

According to this Embodiment, heat can be released from the die pad portion 4D to some of the leads 4 (first and second leads) via the Al ribbon 10. Such improvement in the heat radiation property leads to realization of the semiconductor device 1E having small thermal resistance.

Embodiment 6

Figure 18:
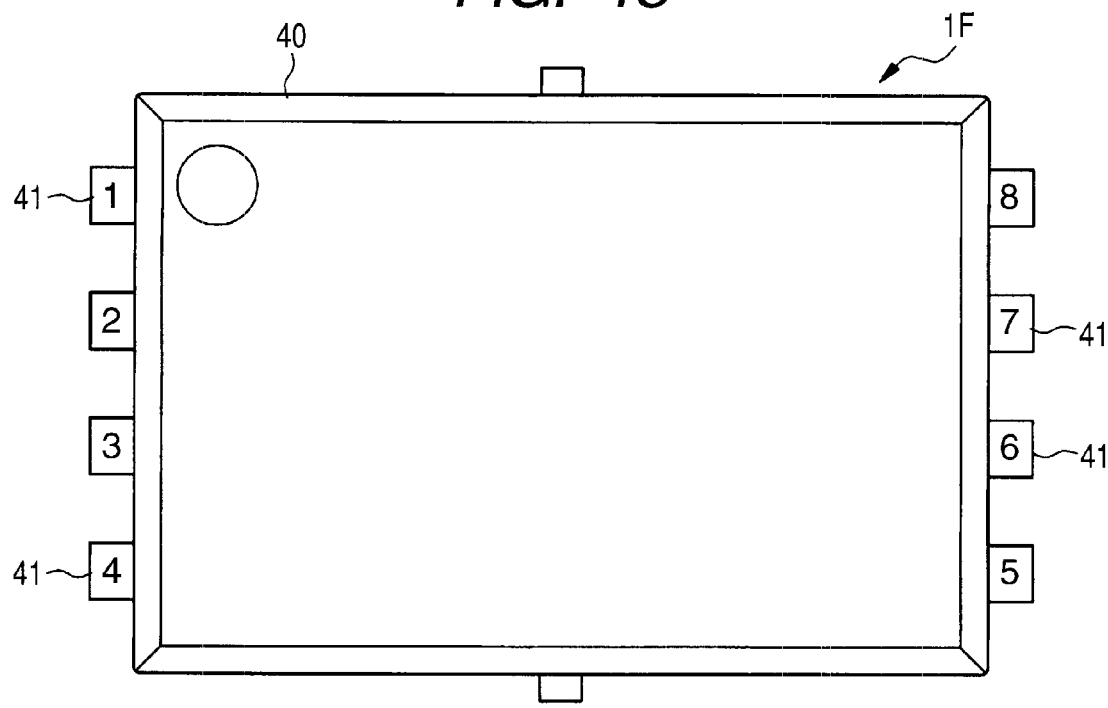
FIG. 18 is a plan view illustrating the appearance of a semiconductor device according to Embodiment 6 of the present invention.
Figure 19:
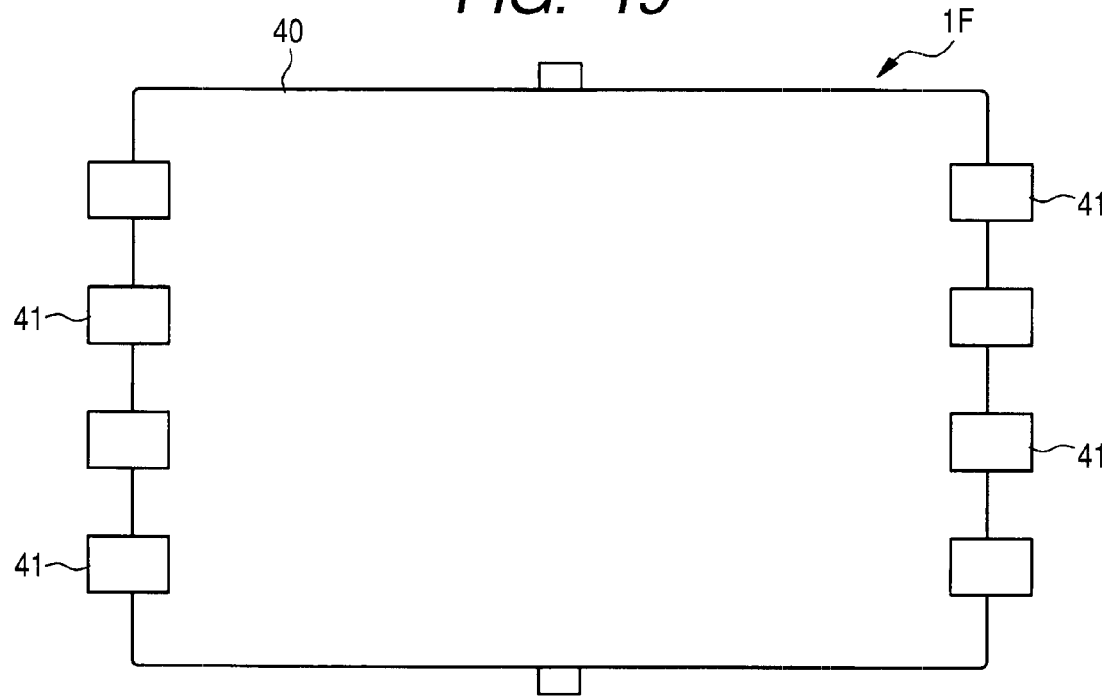
FIG. 19 is a plan view illustrating the appearance of the semiconductor device according to Embodiment 6 of the present invention.
Figure 20:
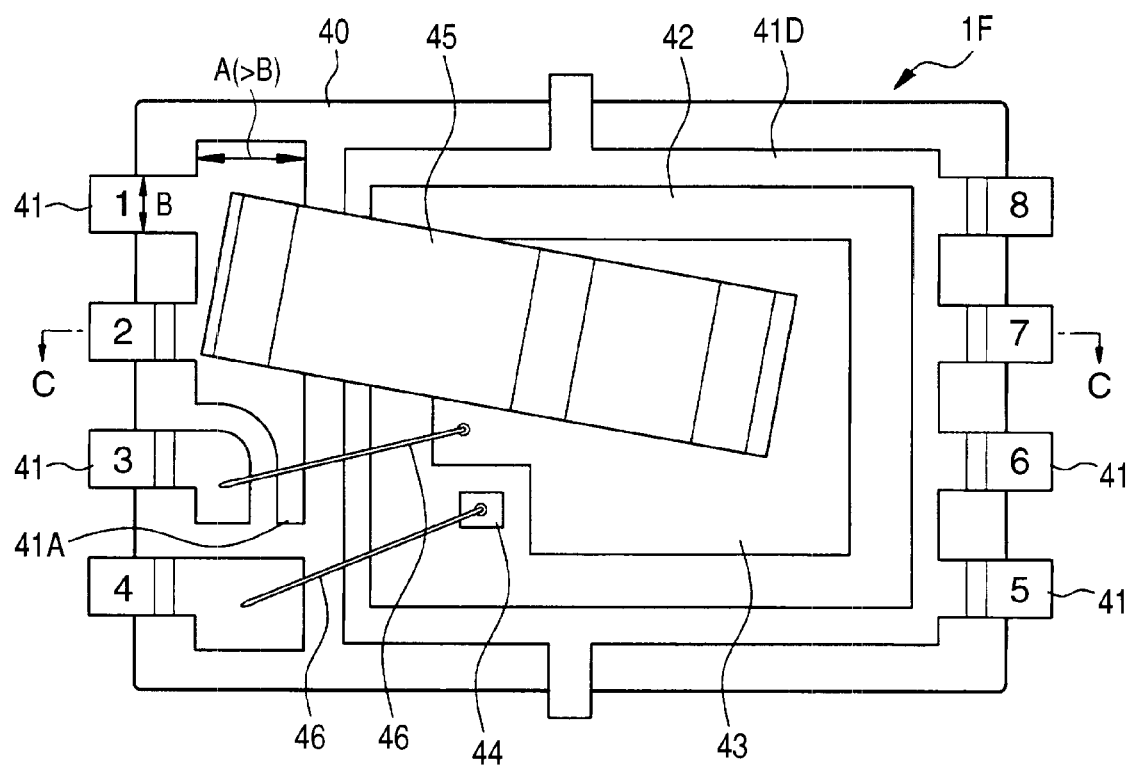
FIG. 20 is a plan view illustrating the inner structure of the semiconductor device according to Embodiment 6 of the present invention.
Figure 21:
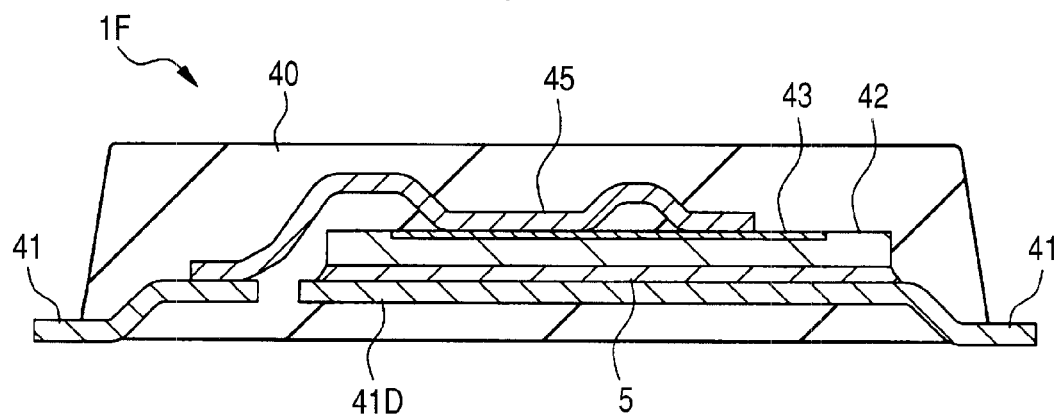
FIG. 21 is a cross-sectional view taken along a line C-C of FIG. 20.

FIGS. 18 to 21 illustrate a semiconductor device according to this Embodiment, in which FIG. 18 is a plan view illustrating the upper surface of a package, FIG. 19 is a plan view illustrating the bottom surface of the package, FIG. 20 is a plan view illustrating the inner structure, and FIG. 21 is a cross-sectional view taken along a line C-C.

A semiconductor device 1F according this Embodiment is a device applied to VSON8 which is a small surface mounted package. From the bottom of a molding resin 40 made of an epoxy resin, outer lead portions of eight leads 41 configuring an external connection terminals of VSON8 are exposed. Of the eight leads 41 shown in FIG. 18, the first to third ones serve as emitter leads, the fourth lead serves as a gate lead and the fifth to eighth leads serve as collector leads.

In the SOP8 according to the above-described Embodiments 1 to 5, the molding resin 2 has an outside dimension of 4.9 mm×3.95 mm (long side×short side), while in the VSON8, the molding resin 40 has an outside dimension of 4.4 mm×3.0 mm (long side×short side). Inside the molding resin 40, a silicon chip 42 having an insulated gate bipolar transistor (IGBT) which will be described later is sealed.

As illustrated in FIG. 20, the silicon chip 42 is mounted on a die pad portion 41D integrated with four leads 41 (fifth to eighth leads) configuring collector leads, with the main surface up. The backside of the silicon chip 42 configures a collector of IGBT and is bonded to the upper surface of the die pad portion 41D via an Ag paste 5. The die pad portion 41D and eight leads 41 (first to eighth leads) are each made of Cu or Fe—Ni alloy similar to the above-described die pad portion 4D and leads 4 of the SOP8. On their surfaces, a three-layered plated layer (Ni/Pd/Au) (not illustrated) having a Pd film as a main component and an Ni film and an Au film stacked thereover and therebelow, respectively is formed.

Over the main surface of the silicon chip 42, an emitter pad (emitter electrode) 43 and a gate pad 44 are formed. The emitter pad 43 and gate pad 44 are made of a conductive film comprised mainly of an Al film and formed as the uppermost layer of the silicon chip 42. The emitter pad 43 has a wider area than the gate pad 44 in order to reduce the on-resistance of the IBGT. For a similar reason, the entire surface of the backside of the silicon chip 42 forms a drain electrode of the IGBT.

As illustrated in FIG. 20, in the semiconductor device 1F of this embodiment, two leads 41 (the first and second leads), of three leads 41 (first to third leads) configuring the emitter leads, are coupled to each other inside the molding resin 40 and a coupled portion of them is electrically coupled to the emitter pad 43 via an Al ribbon 45. The remaining lead 41 (third lead) also configuring the emitter leads is separated from the above-described two leads 41 (first and second leads) and is electrically coupled to the emitter pad 43 via an Au wire 46. The lead 41 (fourth lead) configuring the gate lead is electrically coupled to the gate pad 44 via another Au wire 46.

Of the three leads 41 (first to third leads) configuring the emitter leads, the third lead coupled to the emitter pad 43 via the Au wire 46, configures a sense terminal for driving a gate, while the first and second leads coupled to the emitter pad 43 via the Al ribbon 45 configure a force terminal.

Figure 22:
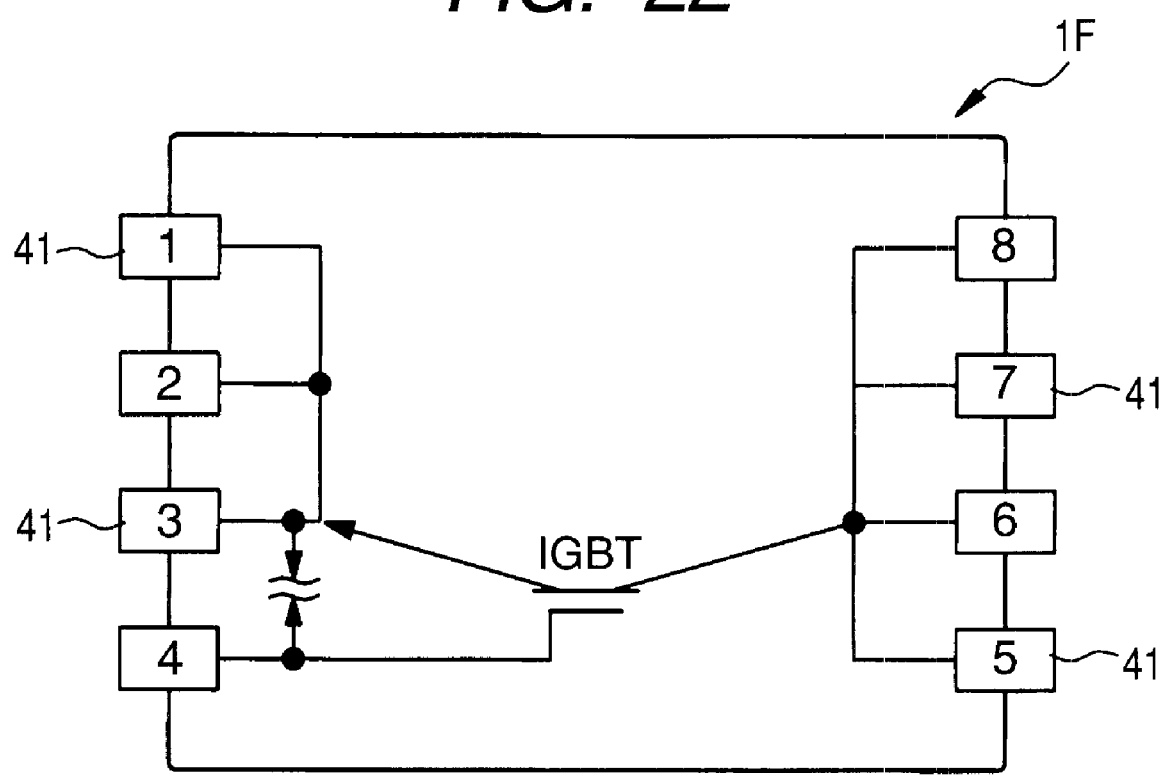
FIG. 22 schematically illustrates the operation of the semiconductor device according to Embodiment 6 of the present invention.

As illustrated in FIG. 22, when a gate voltage is applied between the gate electrode of the IGBT and emitter leads, a voltage drop occurs owing to the passage of an electric current through a wire coupled to the emitter leads. This voltage drop leads to a potential difference between the surface of the silicon chip and emitter leads. A voltage to be input into the silicon chip therefore becomes smaller by that corresponding to the potential difference. An influence of this potential difference is marked as the current becomes greater or the drive voltage becomes lower.

In this Embodiment, in order to overcome this problem, the emitter leads are divided into a sense terminal (third lead) and force terminals (first and second leads). The sense terminal (third lead) is coupled to the emitter pad 43 via the Au wire 46, while the force terminals (first and second leads) are coupled to the emitter pad 43 via the Al ribbon 45. By employing such a structure, when a gate voltage is applied between the gate electrode and emitter leads, an electric current flows on the side of the force terminals (first and second leads) having a lower resistance than that of the sense terminal (third lead) but hardly flows on the side of the sense terminal (third lead) having a higher resistance. As a result, a potential difference does not appear between the gate electrode and emitter leads so that the gate voltage applied between the gate electrode and emitter leads is input into the silicon chip almost without a loss.

When the emitter leads are divided into the sense terminal (third lead) and the force terminals (first and second leads), the coupled area between the first and second leads decreases. This makes it difficult to carry out bonding while placing the long side of the wide Al ribbon 45 and the long side of the silicon chip 42 (the side along the horizontal direction in FIG. 20) in parallel. The positional relationship between the first and second leads of the leads 41 and the emitter pad 43 shown in FIG. 20 or a small area of the emitter pad 43, particularly, small width of it in the vertical direction in FIG. 20 affect the difficulty.

In this case, use of an Al ribbon having a smaller width than that of the Al ribbon 45 shown in FIG. 20 enables bonding of the Al ribbon and the silicon chip 42 while arranging their long sides in parallel. Use of an Al ribbon with a smaller width however decreases a contact area with the leads 41, leading to an increase in the contact resistance between them.

In this Embodiment, as illustrated in FIG. 20, the bonding of the wide Al ribbon 45 to the surface of the emitter pad 43 having a small area is accomplished by diagonal bonding of the Al ribbon 45 to the side of the silicon chip 42 or the side of the molding resin 40. Moreover, as illustrated in FIG. 20, since the width (A) of the coupled portion to which one end of the Al ribbon 45 is to be bonded is made wider than the reference width (B) of the leads 41, the Al ribbon 45 can be coupled to the leads 41 stably even if the diagonal layout is employed for the Al ribbon 45.

When the wide Al ribbon 45 is bonded to the coupled portion of the leads 41 having a small area, the contact area between the clamper of a bonding apparatus and the leads 41 decreases so that the leads 41 cannot be fixed securely by the clamper and there is a danger of a reduction in the adhesion between the Al ribbon 45 and leads 41. In this Embodiment, as illustrated in FIG. 20, an area of the leads 41 configuring the force terminal is increased by causing a portion of the leads 41 (first and second leads) configuring the force terminals to extend between the lead 41 (third lead) configuring the sense terminal and the die pad portion 41D.

Figure 23:
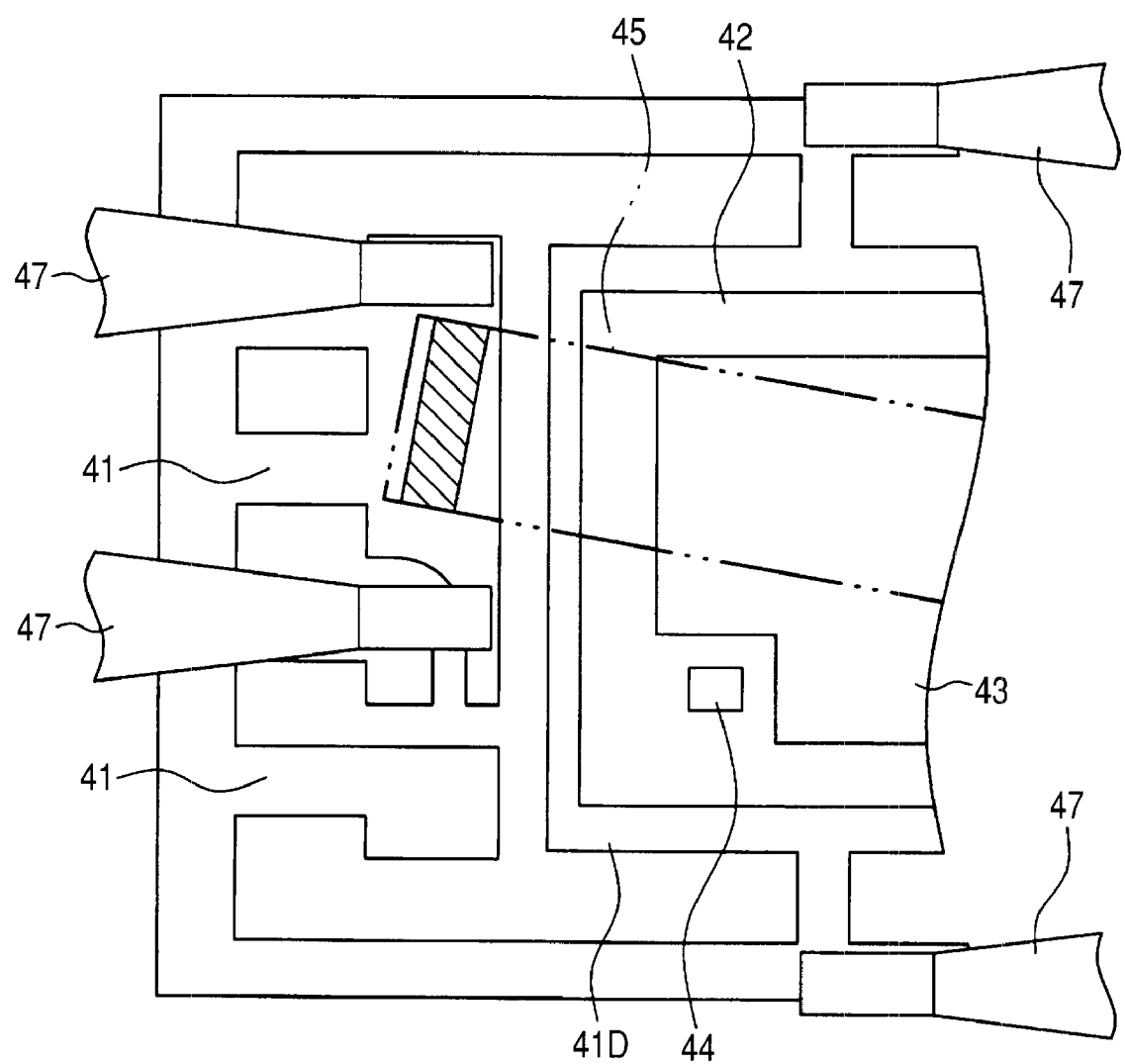
FIG. 23 is a fragmentary plan view showing a contact region of a clamp with a lead during a manufacturing step of the semiconductor device according to Embodiment 6 of the present invention.

This increases the contact area between the clamper 47 of the bonding apparatus and the leads 41 (first and second leads) as illustrated in FIG. 23, making it possible to bond the leads 41 securely by the clamper 47. During wedge bonding of the Al ribbon 45 on the surface of the leads 41 (first and second leads), the oscillation energy of the bonding tool transmits to the Al ribbon 45 securely, leading to improvement in the adhesion between the Al ribbon 45 and leads 41.

Figure 24:
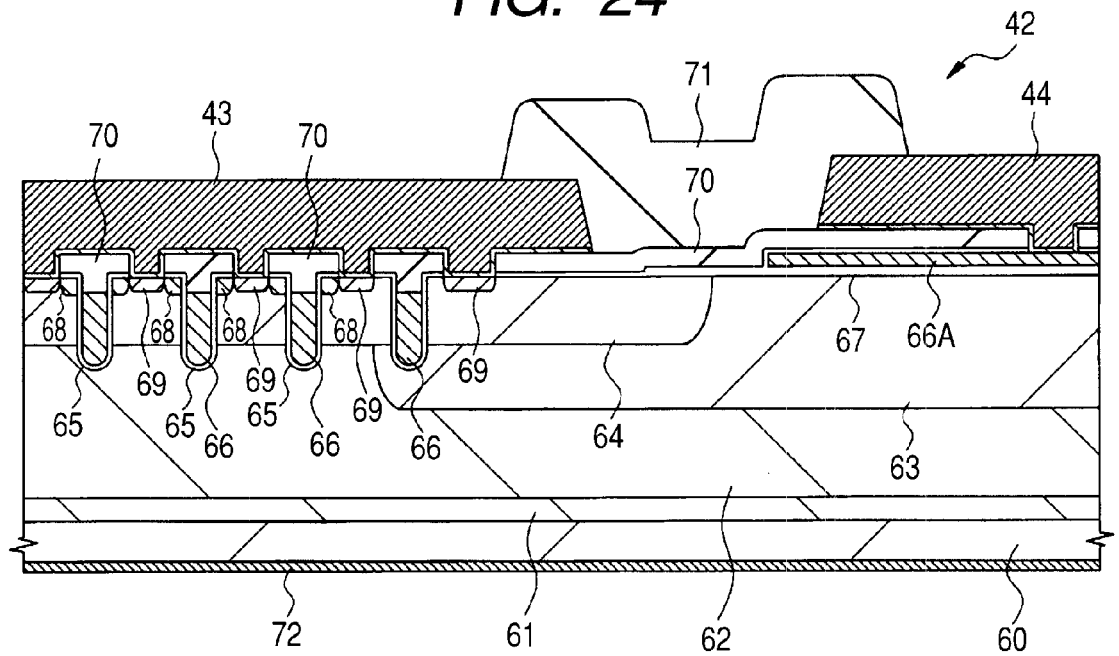
FIG. 24 is a fragmentary cross-sectional view illustrating IGBP formed over the silicon chip.

The IGBT formed on the silicon chip 42 will next be described. FIG. 24 is a fragmentary cross-sectional view of the silicon chip 42 having thereon an n channel trench gate IGBT as one example of the IGBT.

Over a p type collector layer 60, an n type epitaxial layer is formed. The n type epitaxial layer is made of an n type buffer layer 61 and an n type drift layer 62 thereover. The n type drift layer 61 has, thereover, a p type well 63 and an n type base layer 64. A plurality of trenches penetrating the p type base layer 64 and reaching the n type drift layer 62 are formed in a portion of the p type base layer 64.

Inside the plural trenches, a gate insulating film 65 made of a silicon oxide film is formed and inside the gate insulating film 65, a gate electrode 66 is formed. Over the p type well 63, a gate lead electrode 66A is formed via the silicon oxide film 67. The gate electrode 65 and the gate lead electrode 66A are each made of an n type polycrystalline film and they are coupled to each other in an unillustrated region.

On the surface of the p type base layer 62 around the plural trenches, an n type emitter layer 68 and a p type contact layer 69 are formed.

Over the n channel IGBT, an emitter pad 43 is formed via a silicon oxide film 70. The emitter pad 43 is coupled to the p type contact layer 69 via a contact hole formed in the silicon oxide film 70. Over the gate lead electrode 66A, a gate pad 44 is formed via the silicon oxide film 70. The gate pad 44 is coupled to the gate lead electrode 66A via the contact hole formed in the silicon oxide film 70. The emitter pad 43 and the gate pad 44 are made of, for example, a stack of a WSi (tungsten silicide) film and an Al (aluminum) alloy film.

The surface of the silicon chip 42 is, except a region in which the emitter pad 43 and gate pad 44 have been formed, covered with a passivation film 71. The passivation film 71 is made of a stack of, for example, a silicon oxide film and a silicon nitride film. The silicon chip 42 has, on the backside thereof, a collector electrode 72 contiguous to the p type collector layer 60.

Figure 25:
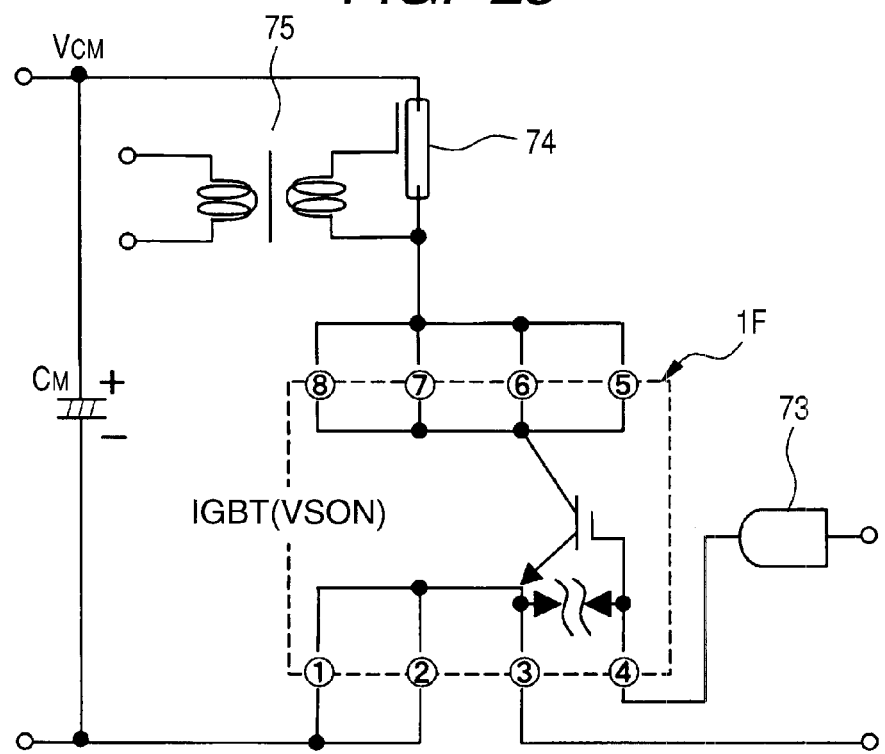
FIG. 25 illustrates one example of a circuit using the semiconductor device of Embodiment 6 of the present invention.

FIG. 25 illustrates one example of a circuit using the semiconductor device 1F of this Embodiment. Indicated at reference numeral 73 is a drive IC of the IGBT, 74 a Xe (xenone) tube and 75 a trigger transformer.

Embodiment 7

Figure 26:
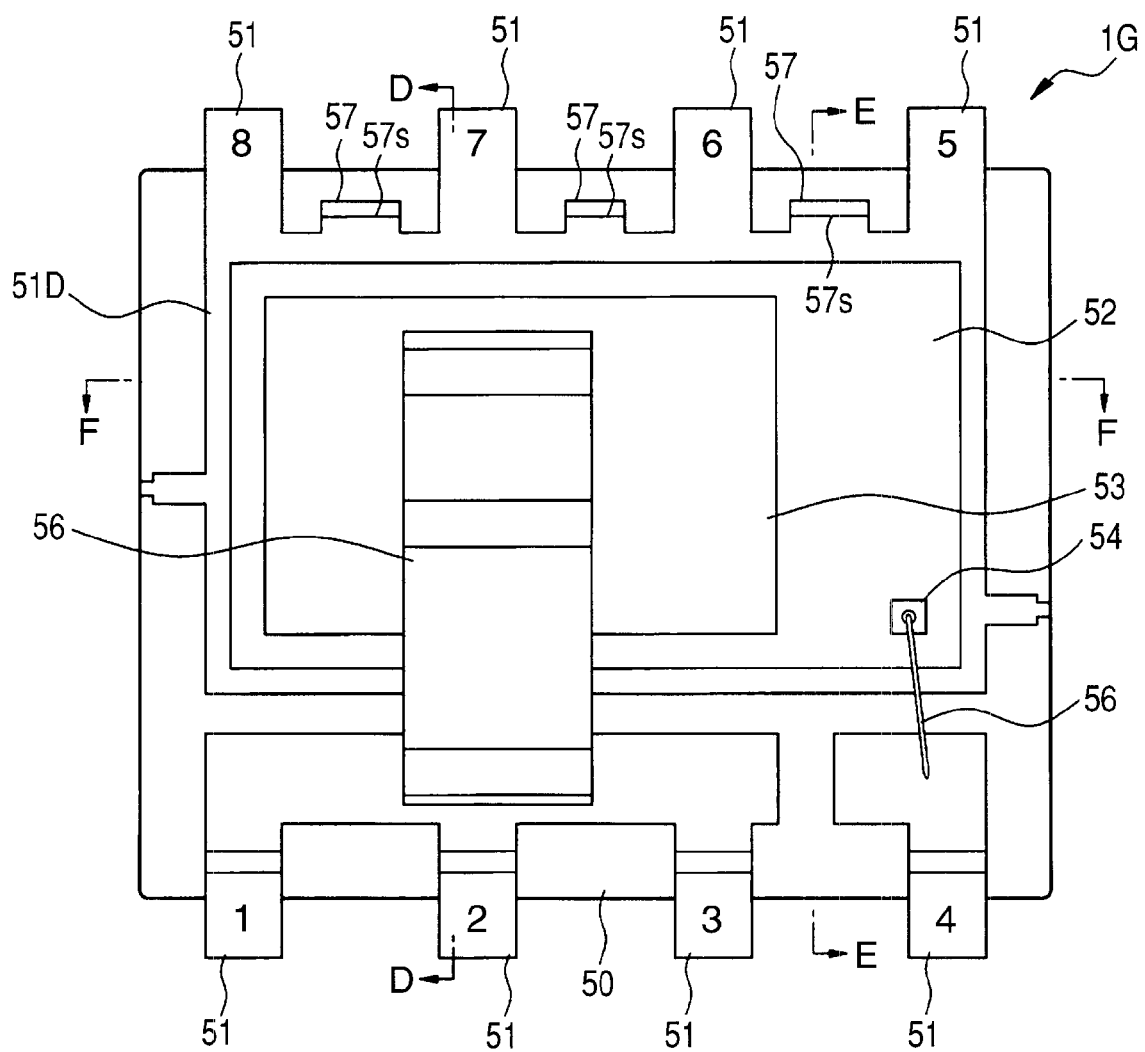
FIG. 26 is a plan view illustrating the inner structure of a semiconductor device according to Embodiment 7 of the present invention.
Figure 27:
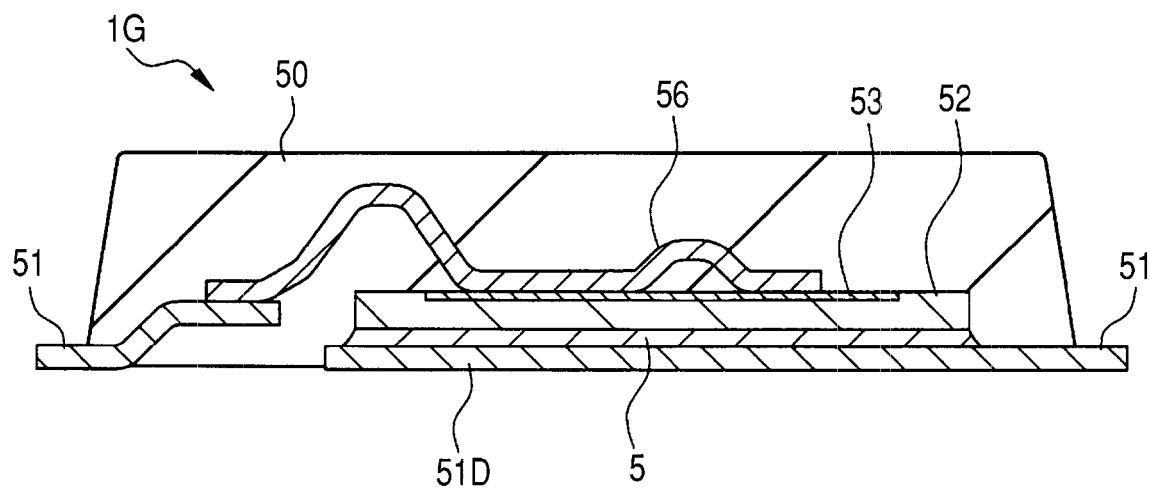
FIG. 27 is a cross-sectional view taken along a line D-D of FIG. 26.
Figure 28:
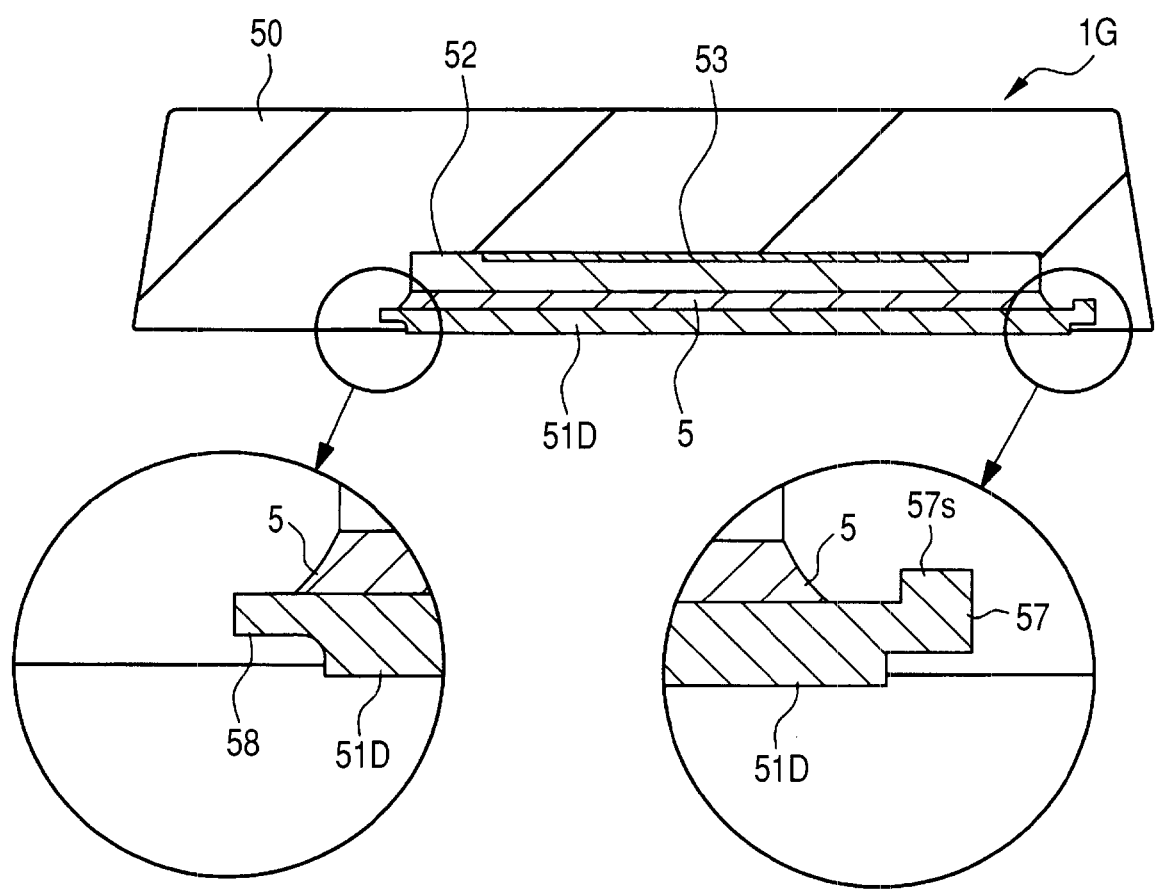
FIG. 28 is a cross-sectional view taken along a line E-E of FIG. 26.
Figure 29:
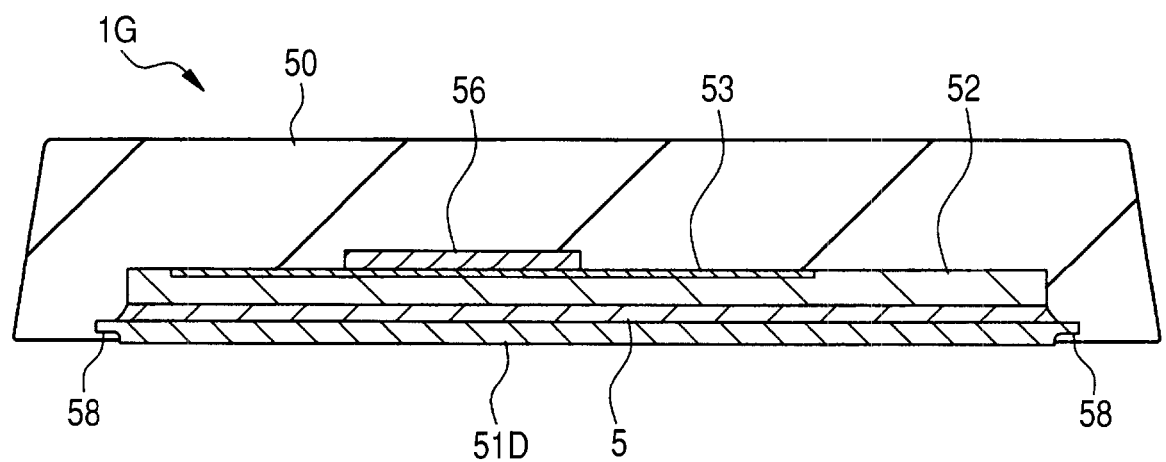
FIG. 29 is a cross-sectional view taken along a line F-F of FIG. 26.

FIGS. 26 to 29 illustrate a semiconductor device according to this Embodiment, in which FIG. 26 is a plan view illustrating the inner structure of the package, FIG. 27 is a cross-sectional view taken along a line D-D of FIG. 26, FIG. 28 is a cross-sectional view taken along a line E-E of FIG. 26, and FIG. 29 is a cross-sectional view taken along a line F-F.

The semiconductor device 1G of this Embodiment is applied to WPAK, one of small surface mounted packages. Outside the molding resin 50 made of an epoxy resin, outer lead portions of eight leads 51 configuring external connection terminals of WPAK are exposed. Of the leads 51 shown in FIG. 26, the first to third ones are source leads, the fourth lead is a gate lead, and the fifth to eighth leads are drain leads.

In the WPAK, the molding resin 50 has an outside dimension of 5.9 mm×4.9 mm (long side×short side). Similar to Embodiment 1, a silicon chip 52 having a power MOSFET formed thereon is sealed inside the molding resin 50. One of the features of WPAK is that the backside of a die pad portion 51D having the silicon chip 52 mounted thereon is exposed outside the molding resin 50 and the die pad portion 51D is caused to function as a heat sink in order to reduce the thermal resistance of the package.

The silicon chip 52 is mounted over a die pad portion 51D integrated with four leads 51 (fifth to eighth leads) configuring drain leads, with the main surface up. The backside of the silicon chip 52 configures a drain of the power MOSFET and is bonded to the upper surface of the die pad portion 51D via an Ag paste 5. The die pad portion 51D and eight leads 51 (first to eighth leads) are each made of Cu or Fe—Ni alloy. On their surfaces, a three layered deposit (Ni/Pd/Au) (not illustrated) having a Pd film as a main component and a Ni film and an Au film stacked thereover and therebelow, respectively, is formed.

Over the main surface of the silicon chip 52, a source pad (source electrode) 53 and a gate pad 54 are formed. The source pad 53 and gate pad 54 are made of a conductive film comprised mainly of an Al film and formed as the uppermost layer of the silicon chip 52. The source pad 53 has a wider area than the gate pad 54 in order to reduce the on-resistance of the power MOSFET. For a similar reason, the entire surface of the backside of the silicon chip 52 configures a drain electrode of the power MOSFET.

In the semiconductor device 1G of this embodiment, similar to the semiconductor device (SOP8) 1A of Embodiment 1, three leads 51 (first to third leads) configuring the source lead are coupled to each other inside the molding resin 50 and a coupled portion of them is electrically coupled to the source pad 53 via an Al ribbon 55. The lead 51 (fourth lead) configuring the gate lead is electrically coupled to the gate pad 54 via one of the Au wires 56.

As described above, in the WPAK, the backside of the die pad portion 51D having the silicon chip 52 mounted thereon is exposed outside the molding resin 50. Such a structure tends to cause such a problem that when a space is formed at the interface between the molding resin 50 and the die pad portion 51D (and lead 51) owing to a difference in the thermal expansion coefficient between them, foreign matters such as water penetrate into the molding resin 50 through this space and deteriorate the Ag paste 5. Especially in the power MOSFET, the backside of the silicon chip 52 configures a drain electrode so that deterioration of the Ag paste 5 leads to an increase in the drain resistance.

In this Embodiment, as one countermeasure against such a problem, a plurality of protrusions 57 are formed along one side (one side on which the drain leads have been formed) of the die pad portion 51D as illustrated in FIG. 26 and these protrusions 57 are equipped with step differences 57s as shown in an enlarged view of FIG. 28. As another countermeasure, half etched portions as shown in an enlarged view of FIG. 28 are formed along three sides (three sides of the die pad portion except the side on which the protrusions 57 have been formed) of the die pad portion 51D. The step differences 57s can be formed, for example, by press working of the protrusions 57. The half etched portions 58 can be formed by a known half etching technology with an etching mask.

The step differences 57s or half etched portions 58 formed at the periphery of the die pad portion 51D are effective for preventing the interfacial separation because the progress of interfacial separation (interfacial misalignment) due to a difference in the thermal expansion coefficient between the molding resin 50 and the die pad portion 51D can be stopped by the step differences 57s or half etched portions 58.

Figure 30:
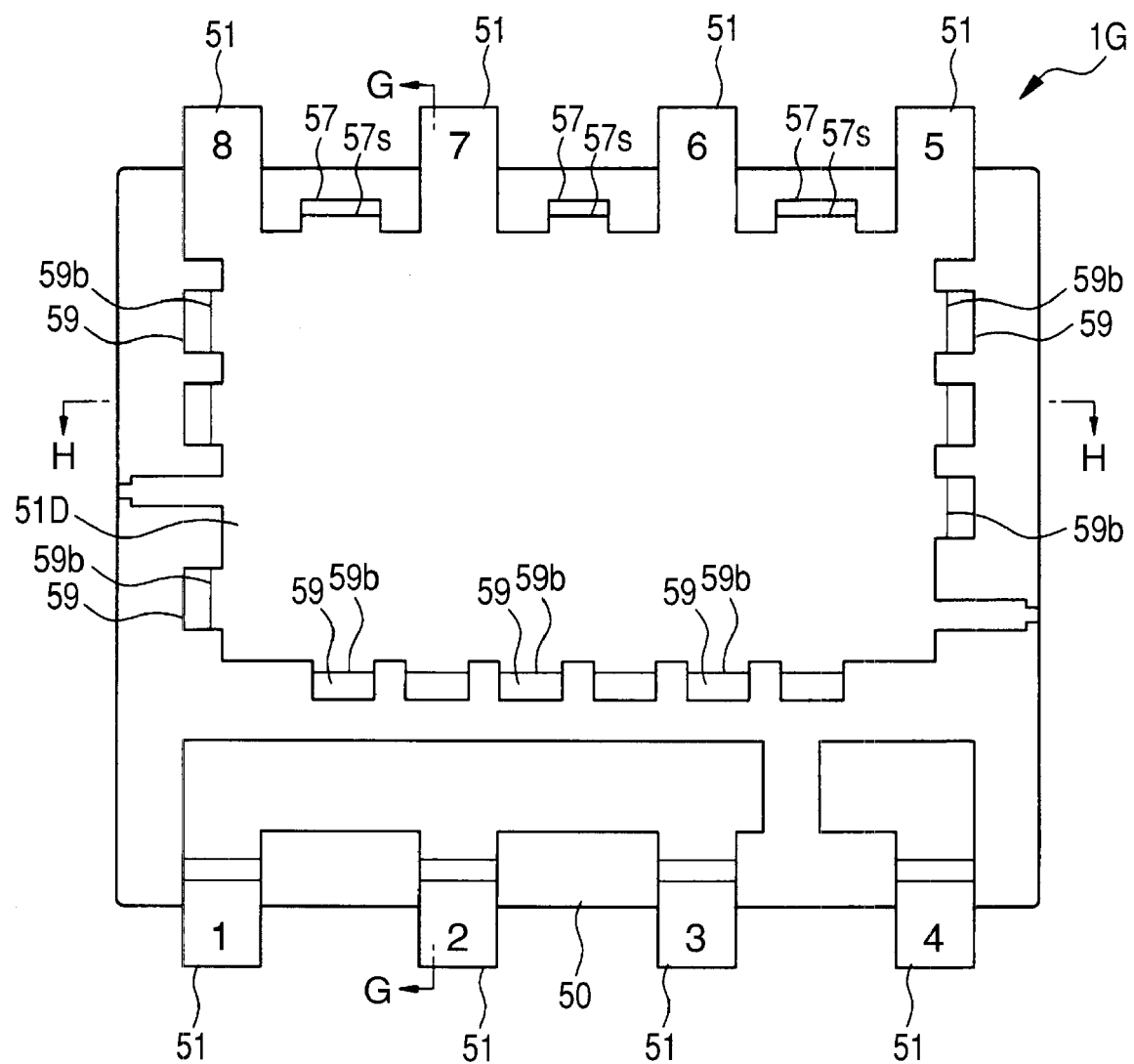
FIG. 30 is a plan view illustrating the inner structure of the semiconductor device according to Embodiment 7 of the present invention.
Figure 31:
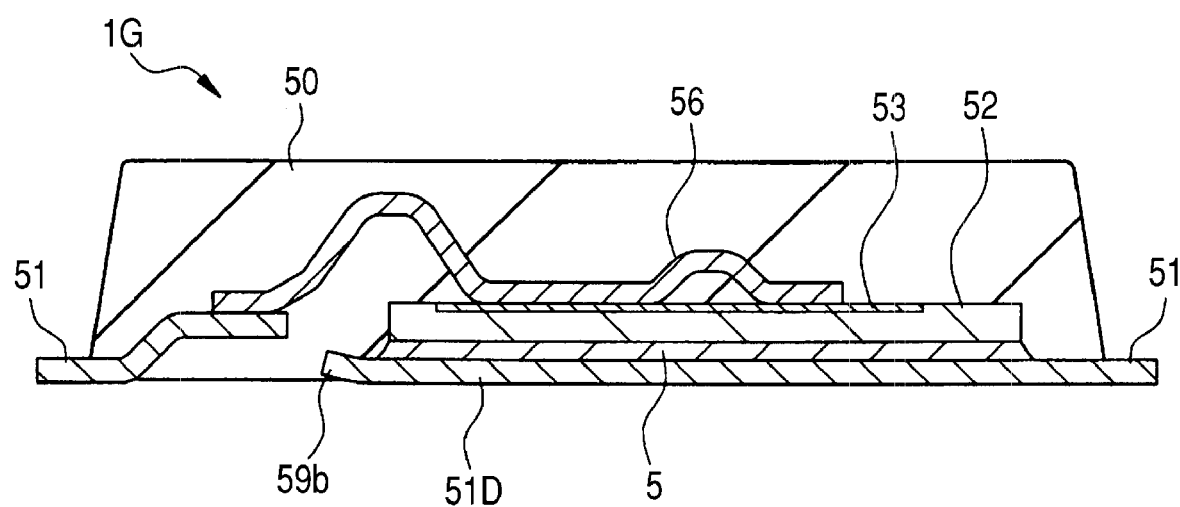
FIG. 31 is a cross-sectional view taken along a line G-G of the present invention.
Figure 32:
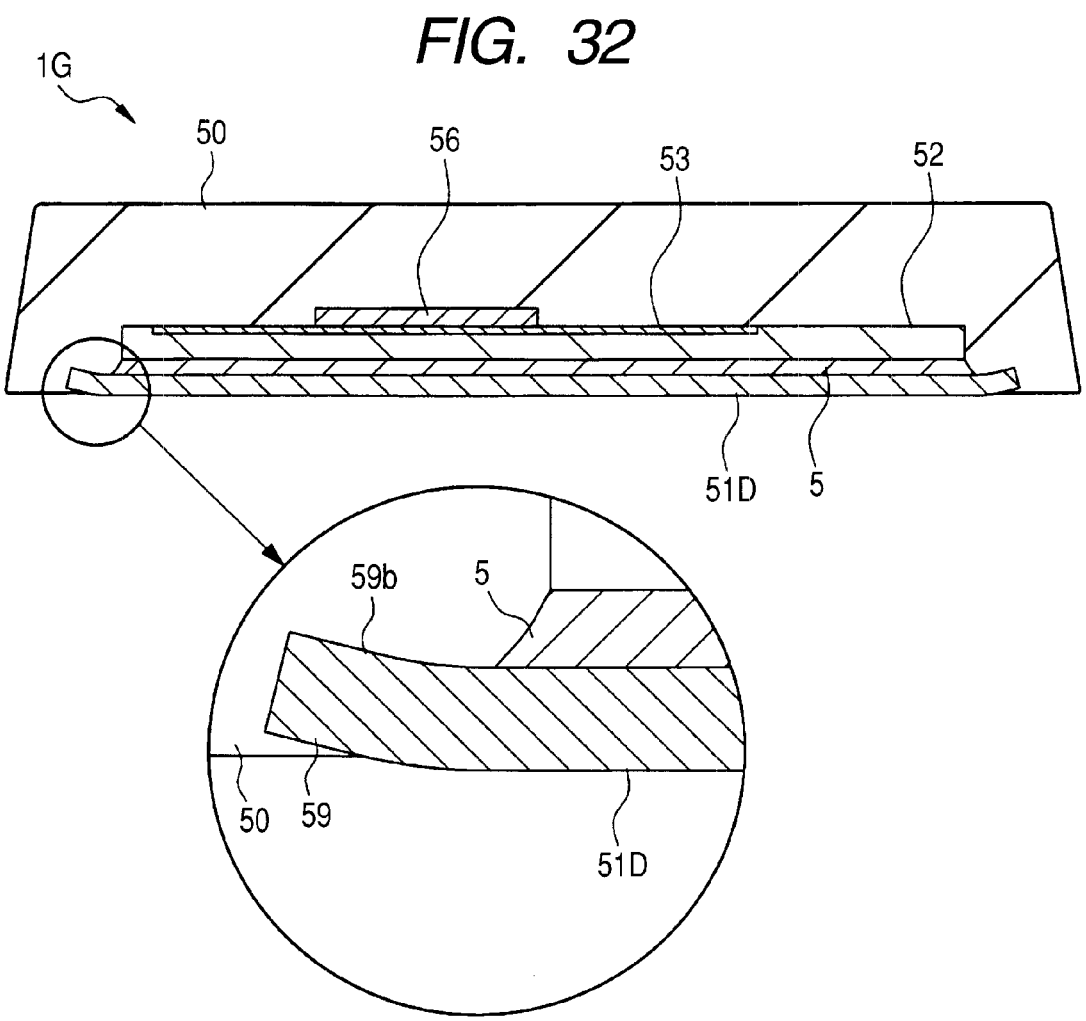
FIG. 32 is a cross-sectional view taken along a line H-H of FIG. 30.

A further example of the countermeasure against interfacial separation between the molding resin 50 and the die pad portion 51D is shown in FIGS. 30 to 32, in which FIG. 30 is a plan view illustrating the inner structure of the package, FIG. 31 is a cross-sectional view taken along a line G-G of FIG. 30, and FIG. 32 is a cross-sectional view taken along a line H-H of FIG. 30. It is to be noted that the silicon chip 52, Al ribbon 55 and Au wire 56 are not illustrated in FIG. 30.

In this example, a plurality of protrusions 59 are formed along three sides (three sides of the die pad portion 51D except the one side along which the protrusions 57 have been formed) of the die pad portion 51D and these protrusions 59 are equipped with bend portions 59b, respectively, as shown in an enlarged view of FIG. 32. The bend portions 59b can be formed, for example, by bending the protrusions 59.

Similar to the step differences 57s or half etched portions 58, the bend portions 59b formed at the periphery of the die pad portion 51D prevent the progress of the interfacial separation (interfacial misalignment), which will otherwise occur due to a difference in the thermal expansion coefficient between the molding resin 50 and the die pad portion 51D so that they are effective for stopping the interfacial separation.

The step differences 57s, half etched portions 58 and bend portions 59b may be formed either singly or in combination.

The present invention made by the present inventors was described specifically based on some Embodiments. It is needless to say that the present invention is not limited to or by these embodiments but can be modified in various ways without departing from the scope of the present invention.

Figure 33:
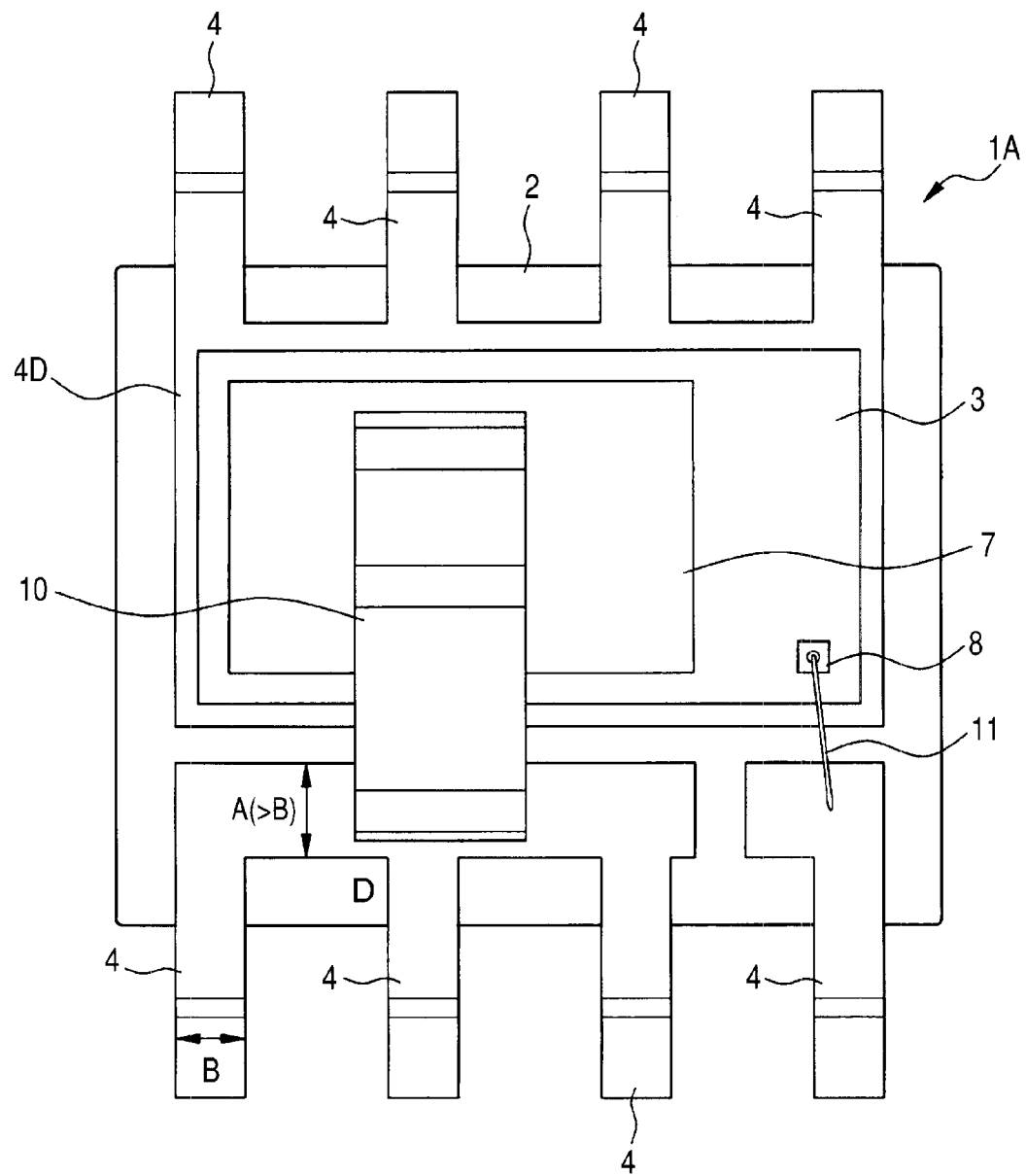
FIG. 33 is a plan view illustrating the inner structure of a semiconductor device according to another embodiment of the present invention.
Figure 34:
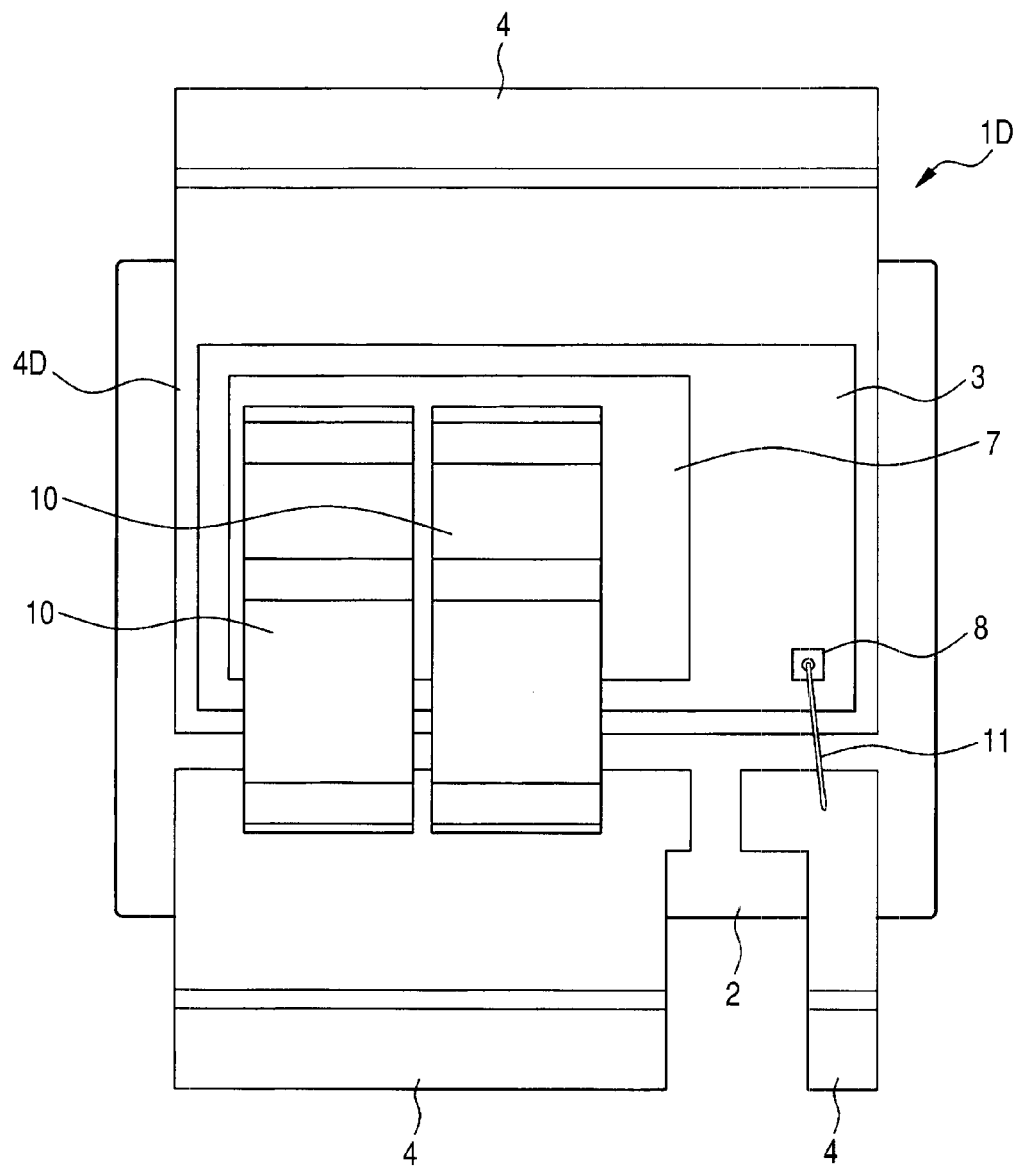
FIG. 34 is a plan view illustrating the inner structure of a semiconductor device according to a further embodiment of the present invention.

For example, as illustrated in FIG. 33, it is desired that in the SOP8 of Embodiment 1, the width (A) of the coupled portion of three leads 4 (first to third leads) configuring the source leads is made wider than the width (B) of the portion (outer lead) exposed from the molding resin 2. This makes it possible to enlarge the contact area between the Al ribbon 10 and leads 4, thereby decreasing the contact resistance therebetween. The VSON8 of Embodiment 6 and WPAK of Embodiment 7 can also have a similar advantage.

In Embodiment 4, a reduction in the on-resistance and improvement of heat dissipation are intended by configuring a source lead, of the leads 4 exposed from the molding resin 2, from a wide lead (refer to FIG. 16). These effects can be heightened further by configuring each of the source lead and drain lead from one wide lead.

Figure 35:
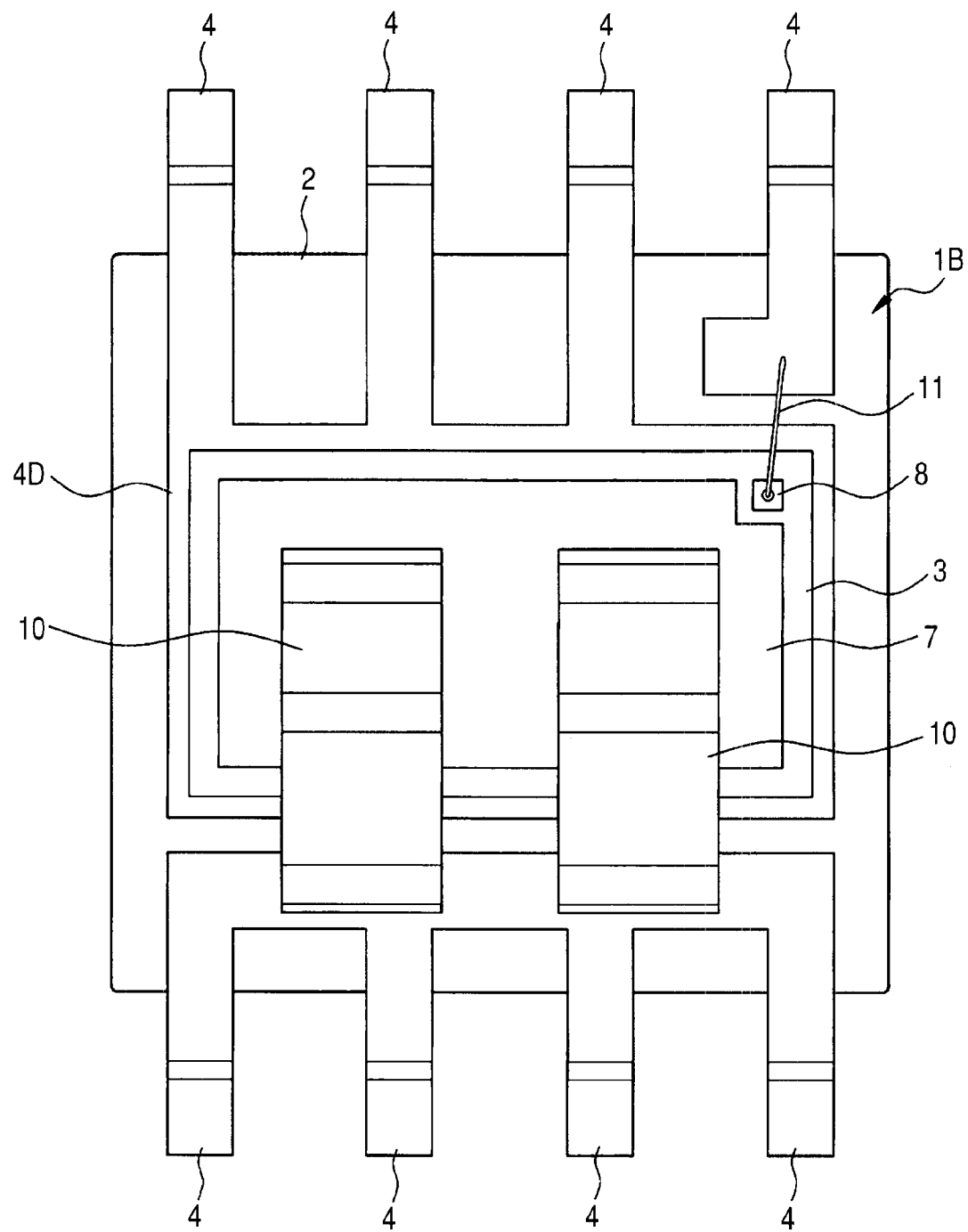
FIG. 35 is a plan view illustrating the inner structure of a semiconductor device according to a still further embodiment of the present invention.

As illustrated in FIG. 7, many power MOSFETs are formed on the surface of the silicon chip 3. As illustrated in FIG. 35, the distance between the Al ribbon 10 and the power MOSFETS can be made uniform and the resistance of the source pad 7 for coupling the Al ribbon 10 to the power MOSFET can be reduced by placing the Al ribbons 10 at almost equal intervals on the surface of the source pad.

In the above-described Embodiments, a silicon chip is mounted onto a die pad portion with an Ag paste, but it is possible to mount the silicon chip on the die pad portion with a pellet attaching material other than Ag paste, for example, Pb free solder.

In the above-described Embodiments, a plated layer comprised mainly of a Pd film is formed on the surface of the lead frame (die pad portion 4D and leads 4). The plated layer is not limited to it. For example, as illustrated in Table 2, the surface of the source lead to which the Al ribbon is coupled may be plated with either one of Ni or Pd (or Cu bare), the surface of the gate lead to which the Al wire is to be coupled may be plated with either one of Ag or Pd (or Cu bare), and the surface of the die pad portion to which the Ag paste is to be applied may be plated with either one of Ag or Pd. Thus, the source lead, gate lead and die pad portion can each be plated with the most suited material.

In the above-described Embodiments, the semiconductor device is applied to SOP8, VSON8 or WPAK, but it can be applied to various small surface mounted packages which are required to have low resistance. In addition, elements formed on the silicon chip are not limited to power MOSFET or IGBT.

In the above-described Embodiments, an Al ribbon is used as a material for coupling a pad having a large area (source pad or emitter pad) to a lead, but a ribbon made of another metal material having a small electric resistance such as Au or Cu alloy is also usable.

The present invention can be utilized for semiconductor devices to be used for a power control switch or a charge/discharge protection circuit of a portable information device.

The invention claimed is:

1. A semiconductor device comprising:
a semiconductor chip mounted over a die pad portion of a lead frame and sealed in a resin package; and
an outer lead portion of the lead frame exposed from the resin package,
wherein the lead frame has a gate lead, a source lead, a drain lead and the die pad portion integrated with the drain lead,
wherein the semiconductor chip has, over a main surface thereof, a gate pad coupled to a gate electrode of a power MOSFET, and a source pad coupled to a source of the power MOSFET and having a greater area than the gate pad,
wherein a backside of the semiconductor chip forming a drain of the power MOSFET is bonded onto the die pad portion with an Ag paste,
wherein the source lead and the source pad are coupled via an Al ribbon, and
wherein the elastic modulus (Pa) of the Ag paste satisfies the following relation:

Pa<2.6×(adhesion thickness of Ag paste)/(displacement permitting ultrasonic bonding of Al ribbon)×(shear strength of Ag paste).

2. A semiconductor device comprising:
a semiconductor chip mounted over a die pad portion of a lead frame and sealed in a resin package; and
an outer lead portion of the lead frame exposed from the resin package,
wherein the lead frame has a gate lead, a source lead, a drain lead and the die pad portion integrated with the drain lead,
wherein the semiconductor chip has, over a main surface thereof, a gate pad coupled to a gate electrode of a power MOSFET, and a source pad coupled to a source of the power MOSFET and having a greater area than the gate pad,
wherein a backside of the semiconductor chip forming a drain of the power MOSFET is bonded onto the die pad portion with an Ag paste,
wherein the source lead and the source pad are coupled via an Al ribbon, and
wherein the elastic modulus of the Ag paste falls within a range of from 0.2 to 5.3 GPa and the shear strength is 8.5 MPa or greater.

* * * * *